United States Patent
Mishaeli et al.

(10) Patent No.: US 10,775,434 B2
(45) Date of Patent: Sep. 15, 2020

(54) SYSTEM, APPARATUS AND METHOD FOR PROBELESS FIELD SCAN OF A PROCESSOR

(71) Applicant: Intel Corporation, Santa Clara, CA (US)

(72) Inventors: Michael Mishaeli, Zichron Yaakov (IL); Larisa Novakovsky, Haifa (IL); Edward Brazil, Leixlip (IE); Alexander Gendler, Kiriat Motzkin (IL)

(73) Assignee: Intel Corporation, Santa Clara, CA (US)

( * ) Notice: Subject to any disclaimer, the term of this patent is extended or adjusted under 35 U.S.C. 154(b) by 59 days.

(21) Appl. No.: 16/142,591

(22) Filed: Sep. 26, 2018

(65) Prior Publication Data

US 2020/0096569 A1    Mar. 26, 2020

(51) Int. Cl.
| | |
|---|---|
| *G01R 31/28* | (2006.01) |
| *G01R 31/3185* | (2006.01) |
| *G01R 31/319* | (2006.01) |
| *G06F 1/3203* | (2019.01) |
| *G06F 11/27* | (2006.01) |

(52) U.S. Cl.
CPC ........ *G01R 31/318533* (2013.01); *G01R 31/31919* (2013.01); *G06F 1/3203* (2013.01); *G06F 11/27* (2013.01)

(58) Field of Classification Search
CPC ...... G01R 31/318533; G01R 31/31919; G01R 31/3187; G01R 31/31921; G01R 31/3183; G01R 31/31724; G06F 9/4498; G06F 11/2236; G06F 11/24; G06F 11/0793; G06F 1/3203; G06F 11/27; G06F 11/0751; G06F 11/0721; G06F 11/079; G06F 11/2242; G11C 29/16; G11C 29/36; G11C 29/846; G11C 2029/3202; G11C 2207/104; G11C 2029/3602; G11C 29/10
See application file for complete search history.

(56) References Cited

U.S. PATENT DOCUMENTS

| | | | |
|---|---|---|---|
| 6,560,740 B1 * | 5/2003 | Zuraski, Jr. ........ | G01R 31/3187 714/727 |
| 2010/0313092 A1 * | 12/2010 | Xu ...................... | G06F 11/2236 714/738 |

(Continued)

OTHER PUBLICATIONS

U.S. Appl. No. 15/825,352, filed Nov. 29, 2017, entitled "System, Apparatus and Method for In-Field Self Testing in a Diagnostic Sleep State" by Vedvyas Shanbhogue, et al.

(Continued)

*Primary Examiner* — Guerrier Merant
(74) *Attorney, Agent, or Firm* — Trop, Pruner & Hu, P.C.

(57) ABSTRACT

In one embodiment, a processor includes a scan system controller to control test operations on the processor in response to test commands from an external test entity, and at least one core to execute instructions. The processor may further include a field scan controller to control a field test mode of the processor to perform a self-test of the at least one core during field operation, where the field scan controller is to obtain a test pattern from an external memory and cause the scan system controller to test circuitry of the first subsystem using the test pattern. Other embodiments are described and claimed.

20 Claims, 17 Drawing Sheets

(56) References Cited

U.S. PATENT DOCUMENTS

2017/0177434 A1* 6/2017 Vandam .............. G06F 11/0721
2018/0231609 A1* 8/2018 Jain ........................ G06F 11/27

OTHER PUBLICATIONS

U.S. Appl. No. 15/599,587, filed May 19, 2017, entitled "System, Apparatus and Method for Performing In-Field Self-Testing of a Processor" by Alexander Gendler, et al.

U.S. Appl. No. 15/818,429, filed Nov. 20, 2017, entitled "Functional Safety Error Reporting and Handling Infrastructure" by Michael N. Derr, et al.

Neerkundar, "What's the Difference Between ATPG and Logic BIST?", https://www.electronicdesign.com/test-amp-measurement/what-s-difference-between-atpg-and-logic-bist, Mar. 10, 2014, 9 pages.

* cited by examiner

SYSTEM, APPARATUS AND METHOD FOR PROBELESS FIELD SCAN OF A PROCESSOR

TECHNICAL FIELD

Embodiments relate to field testing a multicore processor or other integrated circuit.

BACKGROUND

Functional safety refers to ensuring that a system is able to operate correctly and perform appropriately in response to system failures or operator errors. Functional safety is highly important in systems where human lives are at risk. For instance, in systems such as autonomous vehicles, airplanes, or spacecraft, functional safety for mission critical systems is used to monitor and report errors so that corrective action may be performed. As integrated circuits become incorporated into such systems, scan-at-field testing may also be included in such integrated circuits. However, execution of such scan-at-field testing for functional safety and/or structural testing may conflict with normal operation, and can be cumbersome to effect.

DETAILED DESCRIPTION

In various embodiments, a processor or other system on chip (SoC) may be configured for in-field self-testing so that such testing can be performed in a processor (and more particularly core) autonomous manner. Stated another way, in normal field operation, a processor herein is configured to perform probeless scan pattern testing of its internal circuitry using automated test pattern generation-based operation without any connection to external test circuitry such as external probe testers, manufacturing testers or so forth.

Still further as described herein, embodiments enable this field scan and other self-testing to occur in an optimized manner to reduce downtime of the cores for execution of normal workloads. In addition, embodiments may leverage internal core circuitry provided for probe-based testing, and cache subsystem circuitry for efficiently accessing test patterns from an external memory, loading the test patterns into the cache memory, and causing the dedicated scan controller circuitry to execute such test patterns, under control of additional field scan control circuitry as described herein.

Figure 1:
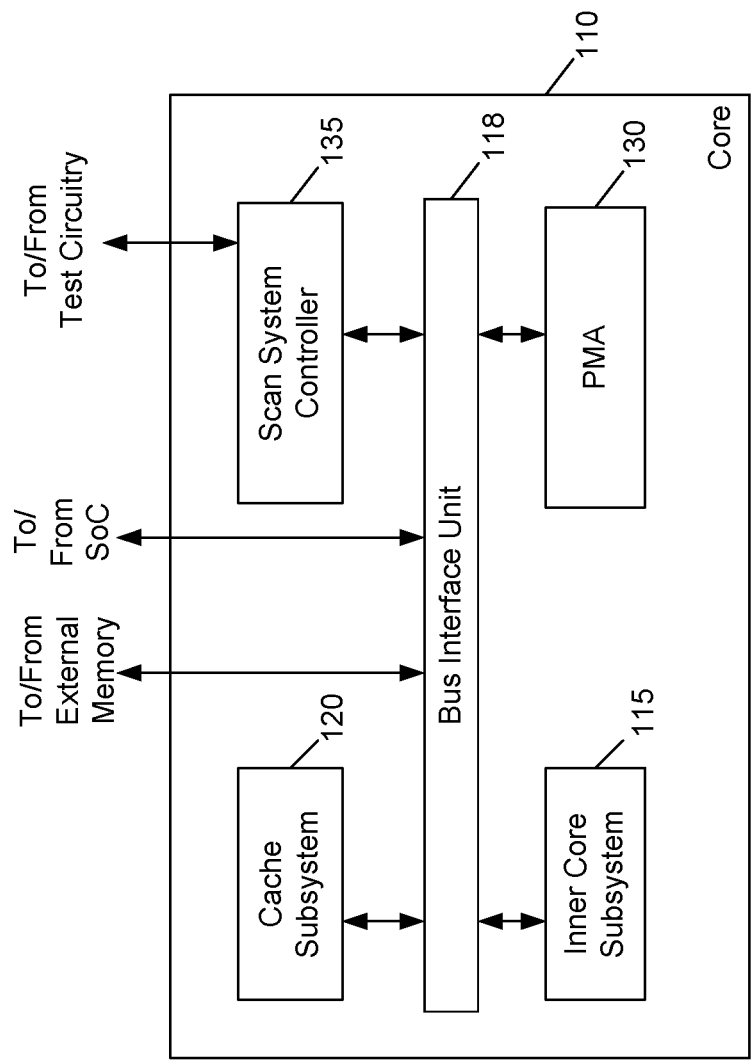
FIG. 1 is a block diagram of a portion of a processor in accordance with an embodiment.

Referring now to FIG. 1, shown is a block diagram of a portion of a processor in accordance with an embodiment. As shown in FIG. 1, processor 100 may be a multicore processor or other SoC. In the embodiment shown in the high level view of FIG. 1, a single core 110 is illustrated, also at a high level. Core 110 includes an inner core subsystem 115, which may include the majority of the processing circuitry of core 110, such as one or more processor pipelines, register storage and so forth. In addition, a cache subsystem 120 is present. In embodiments herein, cache subsystem 120 may be implemented as a mid-level cache (MLC) cluster that includes at least one cache memory e.g., a mid-level cache, cache controller circuitry, prefetch circuitry, additional queuing structures such as at least one request queue, and interface circuitry to interface cache subsystem 120 to other circuitry of core 110, including circuitry within inner core subsystem 115, among other components shown in FIG. 1. As further described herein, cache subsystem 120 may further include a field scan controller, which may be implemented as hardware circuitry, firmware, software, and/or combinations thereof. In a particular embodiment, this field scan controller may be implemented as one or more finite state machines to control probeless in-field self-testing of core 110, and more particularly circuitry within inner core subsystem 115. In turn, this field scan controller may interact with a scan system controller 135. In embodiments, scan system controller 135 is configured to perform testing, either under control of the field scan controller or an external control entity, such as an external tester (e.g., in the case of manufacturing testing, debug or other external operations or so forth).

As illustrated in FIG. 1, core 100 further includes a bus interface unit (BIU) 118 that acts as an interface between various components within core 100 and further acts as an interface to core-external components, including additional portions of an SoC such as one or more other cores, uncore circuitry such as a main SoC power controller and so forth, and external memory, e.g., by way of a SoC-included memory controller. Note further as shown in FIG. 1, cache subsystem 120 is isolated from inner core subsystem 115. In embodiments herein, in-field self-testing can occur during normal field operation of processor 110. The field scan controller within cache subsystem 120 may interface with other system components to obtain test patterns, e.g., from an external memory, and control scan system controller 135 to cause such test patterns to test circuitry within inner core subsystem 115.

In this way, the field scan controller within cache subsystem 120 may operate in a core autonomous testing mode to dynamically and during normal operation of core 110, halt execution of all threads within core 110, cause appropriate context to be saved, obtain appropriate test patterns, initiate testing leveraging scan system controller 135 to test or otherwise exercise circuitry within inner core subsystem 115, obtain results of such testing and report it as appropriate according to a given testing policy. Thereafter, the field scan controller can cause the prior context of core 110 to be restored to initiate continued activity within core 110.

As further illustrated, core 110 includes a power management agent (PMA) 130 that is configured to control power management operations internally to core 110. To this end, PMA 130 may interface with a processor-wide power controller such as a power control unit (PCU). PMA 130 may perform certain power management activities with regard to core 110 autonomously. Still further as described herein, PMA 130 may enable operation in a scan power mode to enable the testing described herein to be performed as rapidly as possible, reducing latency and delays associated with such testing so that running threads can quickly go back to normal operation. Understand while shown at this high level in the embodiment of FIG. 1, many variations and alternatives are possible. For example, in other embodiments the field scan controller may be located elsewhere within the core (but still external to inner core subsystem 115).

Figure 2:
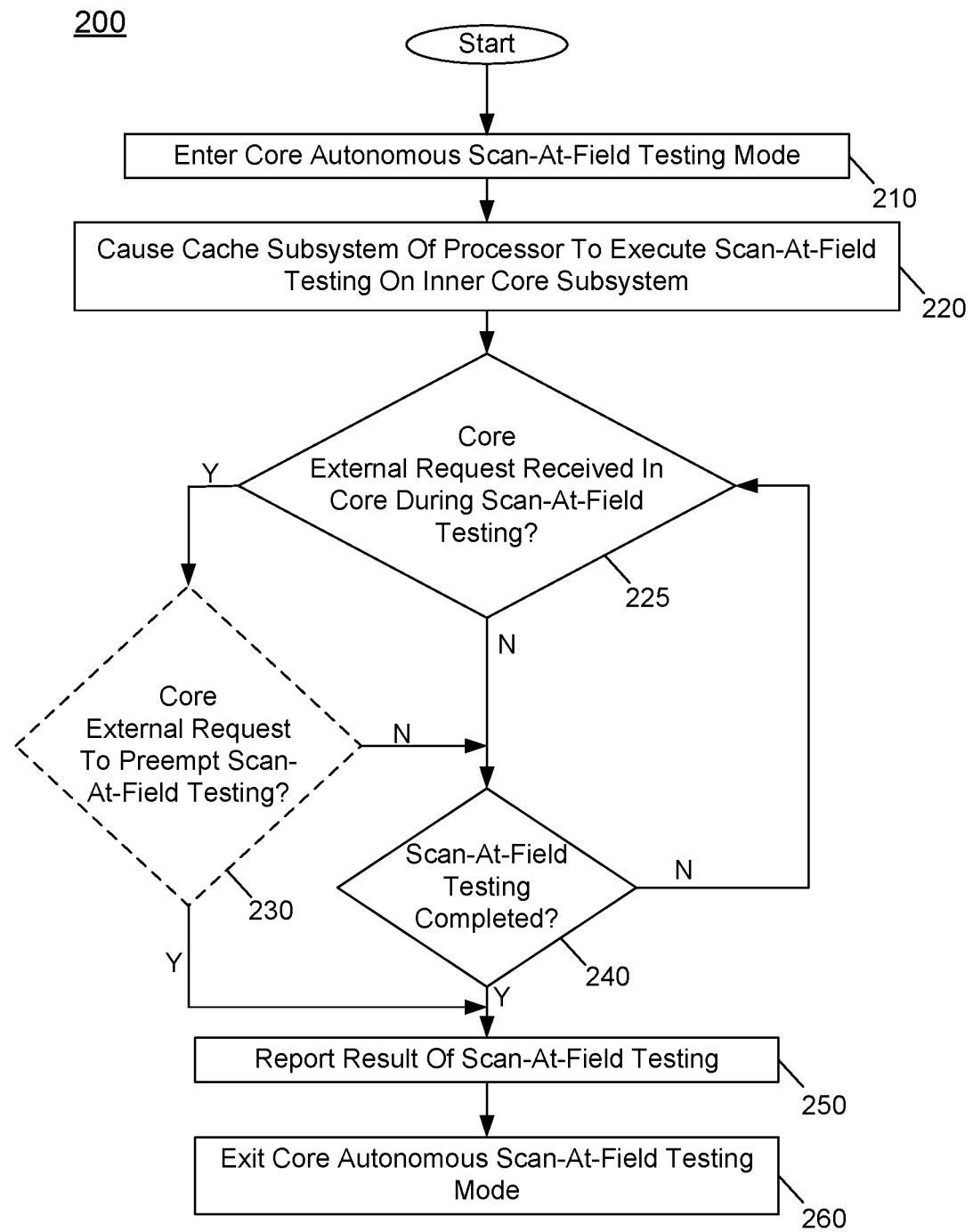
FIG. 2 is a flow diagram of a method in accordance with an embodiment of the present invention.

Referring now to FIG. 2, shown is a flow diagram of a method in accordance with an embodiment of the present invention. More specifically as shown in FIG. 2, method 200 is a high level view of a method for performing structural testing of a core autonomously during normal field operation. As such, method 200 may be performed by hardware circuitry, firmware, software and/or combinations thereof. In a particular embodiment, method 200 may be executed by various circuitry within a core, including cache subsystem-internal circuitry.

As shown, method 200 begins at block 210 when the core enters a core autonomous scan-at-field testing mode. Note that such operation may be initiated in response to an external request, which may be received, e.g., periodically during normal operation. As an example, firmware or an operating system of different systems may trigger scan-at-field testing according to a particular periodic interval, e.g., between approximately 100-200 milliseconds. As one example, such test may be in the context of safety testing, but understand that embodiments are equally applicable to other self-testing operations. In other cases, the core autonomous scan-at-field testing mode may be entered in response to initiation by the field scan controller internal to the core itself, e.g., according to a given periodic interval. And as a further example, the core autonomous scan-at-field testing mode may be initiated in response to software running on the core to be tested that performs a scan instruction. In any case, this core autonomous mode may be initiated and executed by cache subsystem circuitry within the core, which is the orchestration layer for performing self-testing as described herein. Of course in other embodiments, other hardware such as a different hardware orchestration component can be used to execute the scan-at-field testing.

Thus as illustrated in FIG. 2, at block 220 the cache subsystem is caused to execute scan-at-field testing, e.g., on an inner core subsystem. Various details of the self-test techniques are described further herein. Still with reference to FIG. 2, next it is determined whether a core external request is received during the scan-at-field testing (diamond 225). If so, control may pass to optional diamond 230 to determine whether this core external request is to preempt the currently proceeding scan-at-field testing. For example, if the incoming request is an interrupt of at least a particular priority level, the interrupt is allowed to preempt scan-at-field testing. Instead if a lower-level interrupt or some other type of request, e.g., a snoop request (which also may be priority dependent) is received, it may be determined not to preempt the scan-at-field testing.

If scan-at-field testing is determined to be preempted, control passes to block 250 where a result of the scan-at-field testing may be reported, e.g., by logging results within a test log. Thereafter, control passes from block 250 to block 260 where the core autonomous scan-at-field testing mode is exited and normal core operation proceeds. In this instance where control passes by way of this preemption, the testing is not completed, and the core returns to its previously executing mode for further operation, including handling the interrupt or other reason for preemption.

Still with reference to FIG. 2 instead if it is determined that there is no core external request received or that the request is not to preempt the scan-at-field testing, control passes to diamond 240 to determine whether the scan-at-field testing is completed. If not, control passes back to diamond 225 to determine whether a core external request is received during the scan-at-field testing. When the testing is completed, the result may be reported and the test mode exits (blocks 250 and 260). Understand while shown at this high level in the embodiment of FIG. 2, many variations and alternatives are possible.

Figure 3:
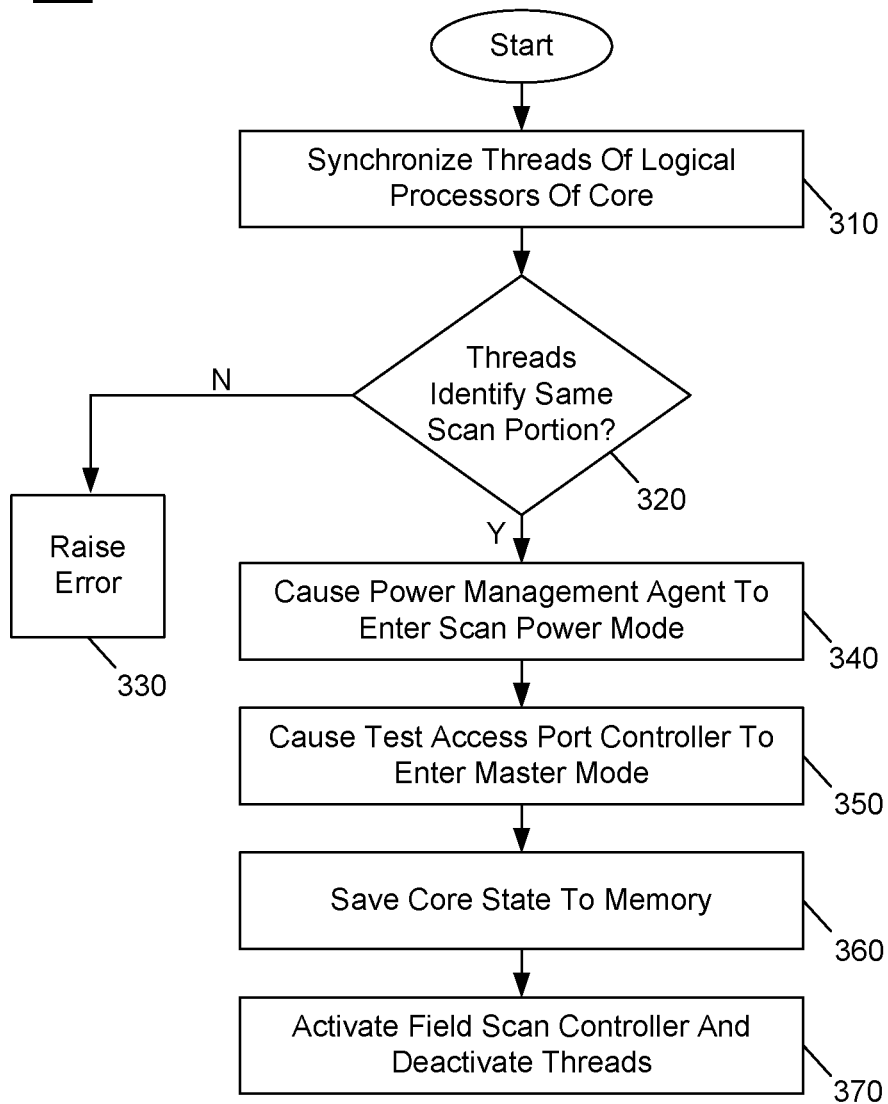
FIG. 3 is a flow diagram of a method in accordance with another embodiment of the present invention.

Referring now to FIG. 3, shown is a flow diagram of a method in accordance with another embodiment of the present invention. As shown in FIG. 3, method 300 is a method for performing autonomous core self-testing in accordance with an embodiment. As such, method 300 may be performed by hardware circuitry, firmware, software and/or combinations thereof. In a particular embodiment, method 300 may be executed by various circuitry within a core, including cache subsystem-internal circuitry.

As illustrated, method 300 begins by synchronizing multiple threads that execute on multiple logical processors of the core (block 310). Next it is determined whether these threads identify the same portion of a scan pattern for which self-testing is to be performed (diamond 320). Understand that additional validity checks can be performed on the provided parameters of the requested scan operation. If such validity checks fail, control passes to block 330 where an error may be raised.

Otherwise if it determined that the threads correctly identify the same scan pattern portion and/or other validity checks pass, control passes to block 340 where a PMA is caused to enter into a scan power mode. Note that in embodiments herein, this scan power mode may include operation of the core at a higher performance state (if available), to enable the self-testing to be rapidly performed, reducing impact on normal operation. As will be described further below, in this scan power mode, additional power management operations may occur.

Still with reference to FIG. 3, next at block 350 a test access port (TAP) controller (which may be a state of a finite state machine of a field scan controller) is caused to enter into a master mode and thereafter a current state of the core (e.g., the core context) can be saved to memory (block 360). Although the scope of the present invention is not limited in this regard, in one embodiment this memory may be an internal memory of the processor such as a C6 static random access memory (SRAM) storage. Next at block 370, a field scan controller, which as discussed above is an internal controller of a cache subsystem of a core, is activated and the one or more threads previously in execution on the core are deactivated. At this point, scan-at-field testing can begin.

Figure 4A:
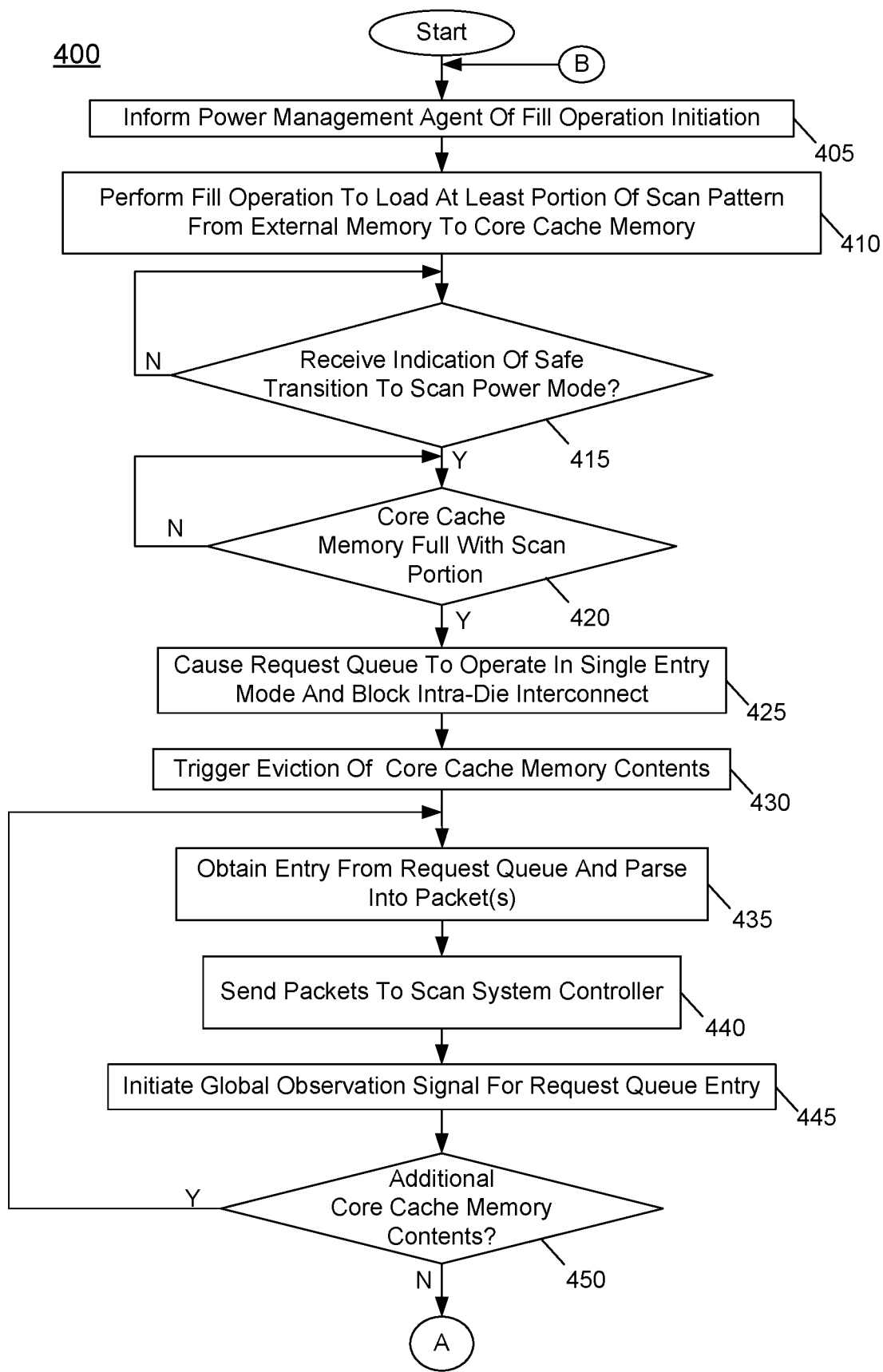
FIGS. 4A and 4B are a flow diagram of a method in accordance with yet another embodiment of the present invention.
Figure 4B:
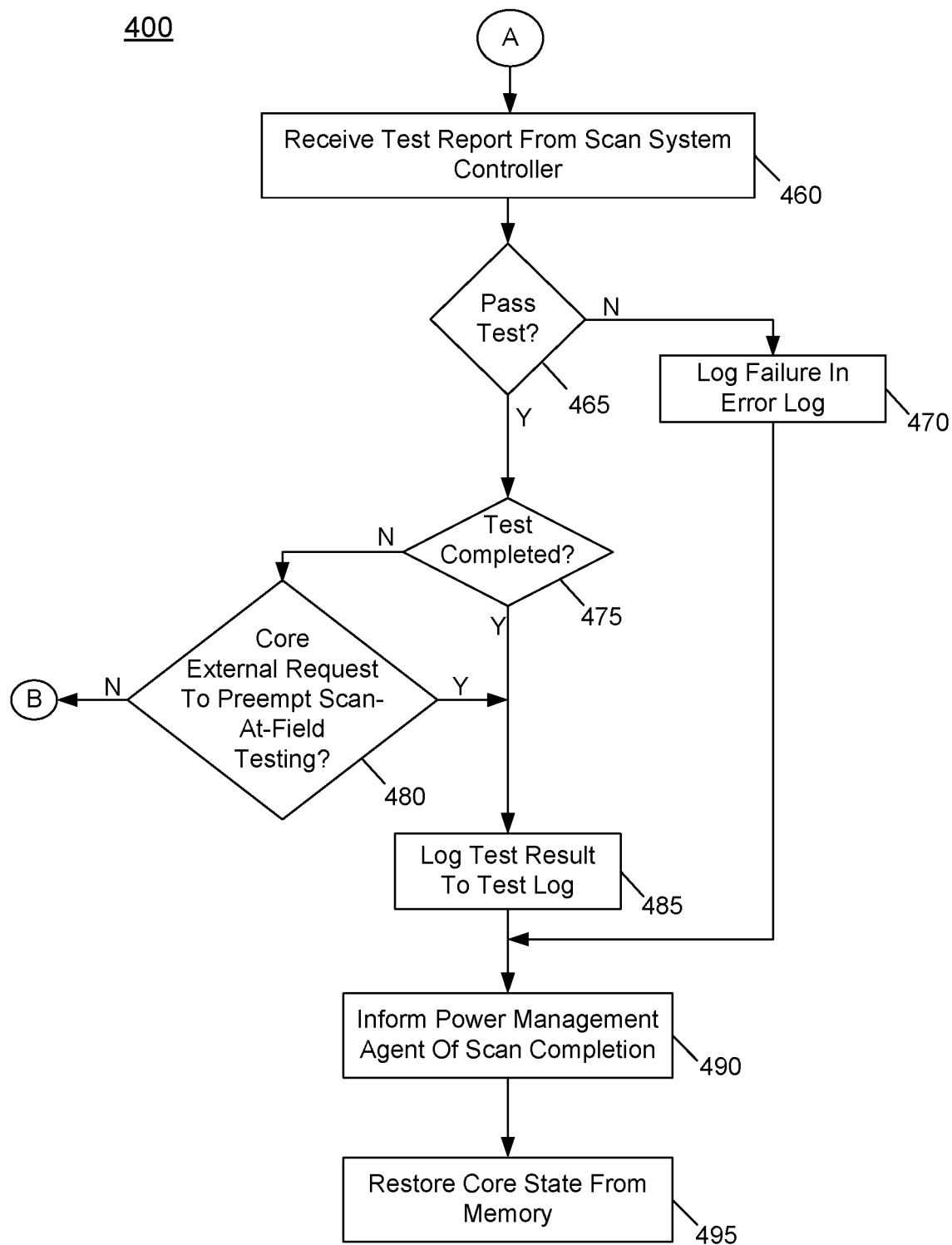

Referring now to FIGS. 4A and 4B, shown is a flow diagram of a method in accordance with yet another embodiment of the present invention. Method 400 is a method for performing autonomous core scan-at-field testing using a field scan controller in accordance with an embodiment. As such, method 400 may be performed by hardware circuitry, firmware, software and/or combinations thereof, such as a field scan controller as described herein.

As illustrated, method 400 begins by informing the PMA of initiation of a fill operation. As this fill operation may incur some amount of latency in obtaining test pattern information from an external memory and loading it into the core, it is an appropriate time for the PMA to effect power management updates, such as increasing a performance state of the core to enable the self-testing to be performed in reduced time. Thereafter at block 410 the field scan controller performs the fill operation to load at least a portion of a scan pattern. More specifically, the scan pattern may be obtained from an external memory, e.g., a DRAM, and stored into an appropriate cache location, such as an MLC.

Still with reference to FIG. 4A it is determined whether an indication of a safe transition to the scan power state has been received from the PMA (diamond 415). Assuming so, control passes to diamond 420 where it is determined whether the core cache memory is full with a requested scan portion. Note in this regard that the cache memory, e.g., a mid-level cache may not have sufficient storage resources to store an entire scan or other test pattern. As such, different chunks of the test pattern can be iteratively obtained and filled into the cache as described herein.

When the cache memory is filled, control next passes to block 425 where a request queue of the cache subsystem is cause to operate in a single entry mode and in addition, an intra-die interconnect that couples this request queue to additional portions of the processor and memory hierarchy is blocked so that these lines are not sent back to memory. Thereafter at block 430 an eviction of the cache memory may be triggered. This eviction causes lines of the cache memory (that store portions of the test pattern) to be placed into a request queue of the cache subsystem.

Instead, as further shown in FIG. 4A at block 435, the field scan controller can obtain a given entry from this request queue. In turn, the field scan controller can parse this cache line into one or more packets of appropriate size for handling by a scan system controller. Although the scope of the present invention is not limited in this regard, in an embodiment incoming cache lines may have a width of 64 bytes. However, the scan system controller and its interface to an external tester (when present) may operate at smaller widths, e.g., 5 bytes. As such, at block 435 the field scan controller can parse the cache line width to this smaller width so that the test pattern can be handled within the scan system controller. Thereafter, at block 440 packets are sent to the scan system controller so that the testing may be performed.

When all packets for a given entry from the request queue have been sent, at block 445 a global observation signal is initiated for that entry so that the entry is marked as completed (such that it can then be overwritten by another line of the test pattern). Next it is determined whether there are additional contents within the core cache memory (diamond 450). If so, control passes back to block 435 where a next cache line can be handled. Otherwise, control passes to diamond 460, illustrated in FIG. 4B, which is a continuation of method 400.

Referring now to FIG. 4B, at block 460 a test report is received in the field scan controller from the scan system controller. Based on this report it is determined at diamond 465 whether the testing performed using the test pattern was successful. If so, a determination is made at diamond 475 whether the testing is completed. Note that this determination is based on an indication as to whether the last scan pattern portion loaded into the cache memory was in fact the last portion of the scan pattern to be used in testing. If not, next it is determined at diamond 480 whether there is any core external request that may preempt the scan-at-field testing. Such determination may be based on receipt of an external request during the present testing and a further determination, optionally, that the request is of at least a given priority level. If it is determined that there is no pending external request that is to preempt the testing, control passes back to the beginning of method 400 to obtain a next scan pattern portion and load it into the cache memory.

Instead when it is determined that the test is completed (or that the current testing is to be preempted) control next passes to block 485. At block 485 test results may be logged in a test log which may be a consolidated log that further includes an error log (or these two logs may be different logs). In any case, at block 485 the test results may be logged into the test log. Thus assuming that the test was successful, appropriate indication of the pass may be entered into an entry in the log to identify the time of the scan-at-field testing and the resulting pass situation. Thereafter at block 490 the PMA is informed of the completion of the scan. Note that in response to receipt of this indication, the PMA may initiate power management activities, such as updating a performance state of the core for the workload to be executed following the scan-at-field testing, such as the prior workload. As further illustrated in FIG. 4B, at block 495 the field scan controller may restore core state from memory, e.g., the C6 SRAM to which the context was saved prior to entry into scan-at-field testing.

Still with reference to FIG. 4B instead if it is determined at diamond 465 that the testing was not successful, control passes to block 470 where a failure may be logged in an error log. This failure indication may include the timestamp identification of the scan-at-field testing and the resulting location within the scan pattern at which the failure occurred (e.g., the point in the scan pattern such as indicated by address and/or the location within the scan circuitry at which the error occurred). As shown after logging any failure at block 470, control passes directly to block 490 to inform the PMA of the completion of the scan operation. Understand while shown at this high level in the embodiment of FIGS. 4A and 4B, many variations and alternatives are possible.

Figure 5:
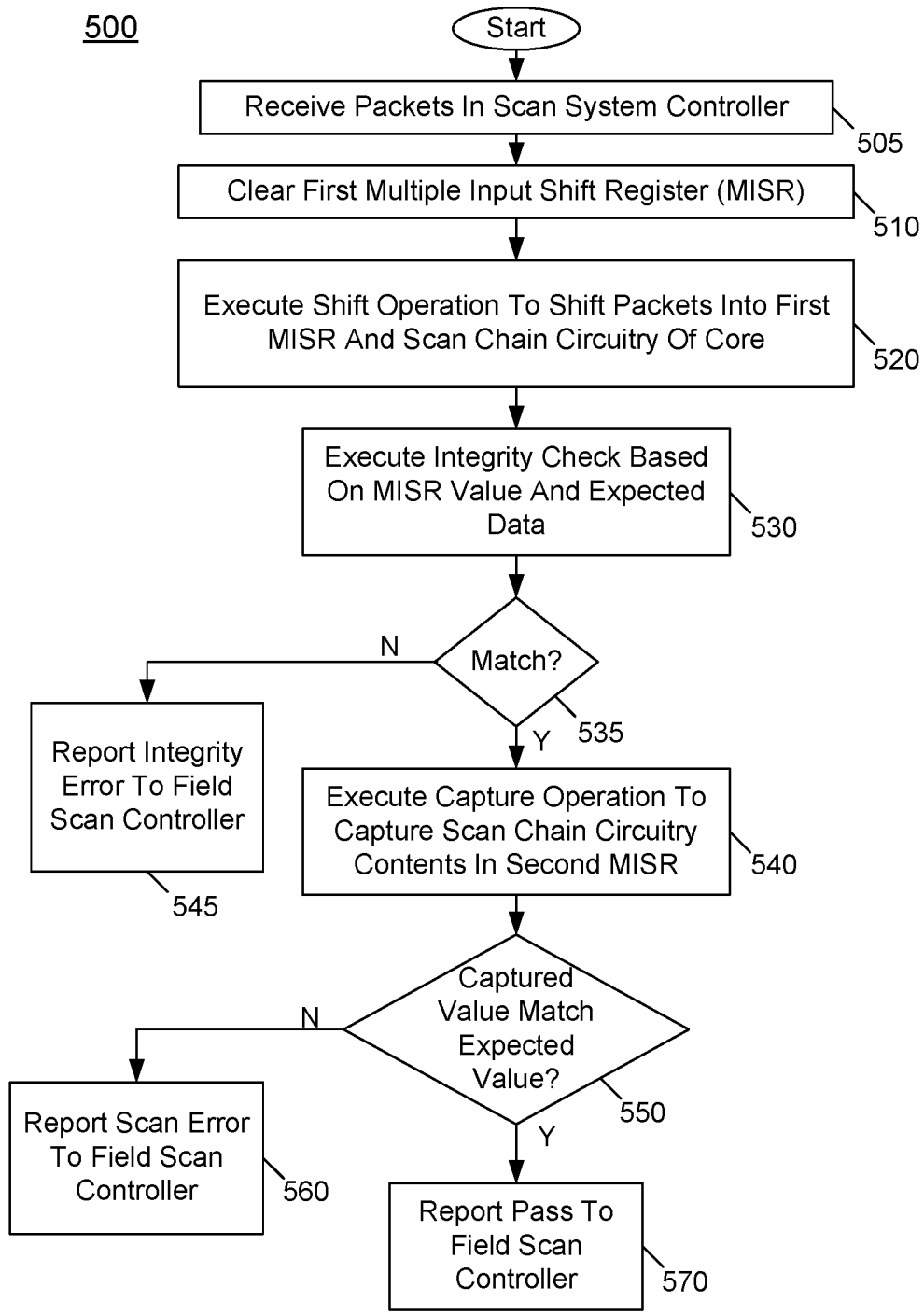
FIG. 5 is a flow diagram of a method in accordance with a still further embodiment of the present invention.

Referring now to FIG. 5, shown is a flow diagram of a method in accordance with a still further embodiment of the present invention. More specifically method 500 is a method for performing scan-at-field testing by a scan system controller of a core. As such, method 500 may be performed by hardware circuitry, firmware, software and/or combinations thereof, such as a scan system controller as described herein.

In general, the scan operation uses two multiple input shift registers (MISRs) of the scan system controller. The first MISR observes the input stream of bits into a scan chain and the second MISR observes the output stream of bits from the scan chain. The sequence of scan operations includes many shift operations followed by an integrity check of the first MISR, followed by capture and then again many additional shifts that produce a stream of output bits, while providing a new set of input bits. The check of the second MISR is done only at the end of the testing, when all the content is driven out of the MLC.

As illustrated, method 500 begins by receiving packets in the scan system controller, from the field scan controller (block 505). Next at block 510 the first MISR is cleared. Then shift operations proceed to shift the packets into the first MISR and further to shift the packets into scan chain circuitry of the core so that structural testing can proceed (block 520). Then at block 530 an integrity check is executed based on the value stored in the first MISR and the expected data. Note that this integrity check may be performed before the scan testing using the test pattern information in the packets. Still with reference to FIG. 5, if it is determined that the MISR value does not match the expected data value, control passes instead to block 545. At block 545 an integrity error may be reported to the field scan controller. Specifically, this integrity error indicates that an error occurred in connection with the communication of the scan pattern somewhere in the path from the external memory to the scan system controller. Understand that in this situation, the field scan controller may take appropriate action, including terminating the execution of the scan program immediately and logging an error.

And if it is determined that these values match (as determined at diamond 535), control passes to block 540 where the scan testing is performed and a capture operation is performed. Namely this capture operation occurs to obtain a snapshot of the values of the state elements of the scan chain circuitry. Then numerous shift operations are performed to shift out the scan chain contents into the second MISR. Next at diamond 550 it is determined whether the captured value matches the expected value as present in the first MISR. If so, control passes to block 570 where a pass situation is reported to the field scan controller.

Still with reference to FIG. 5 instead if it is determined that the captured value does not match the expected value, control passes to block 560 where a scan error is reported to the field scan controller. Note that this error report may include an identification of the point at which the error occurred within the scan pattern and, optionally, a location of the error occurrence within the scan chain circuitry. Understand while shown at this high level in the embodiment of FIG. 5, many variations and alternatives are possible.

Figure 6:
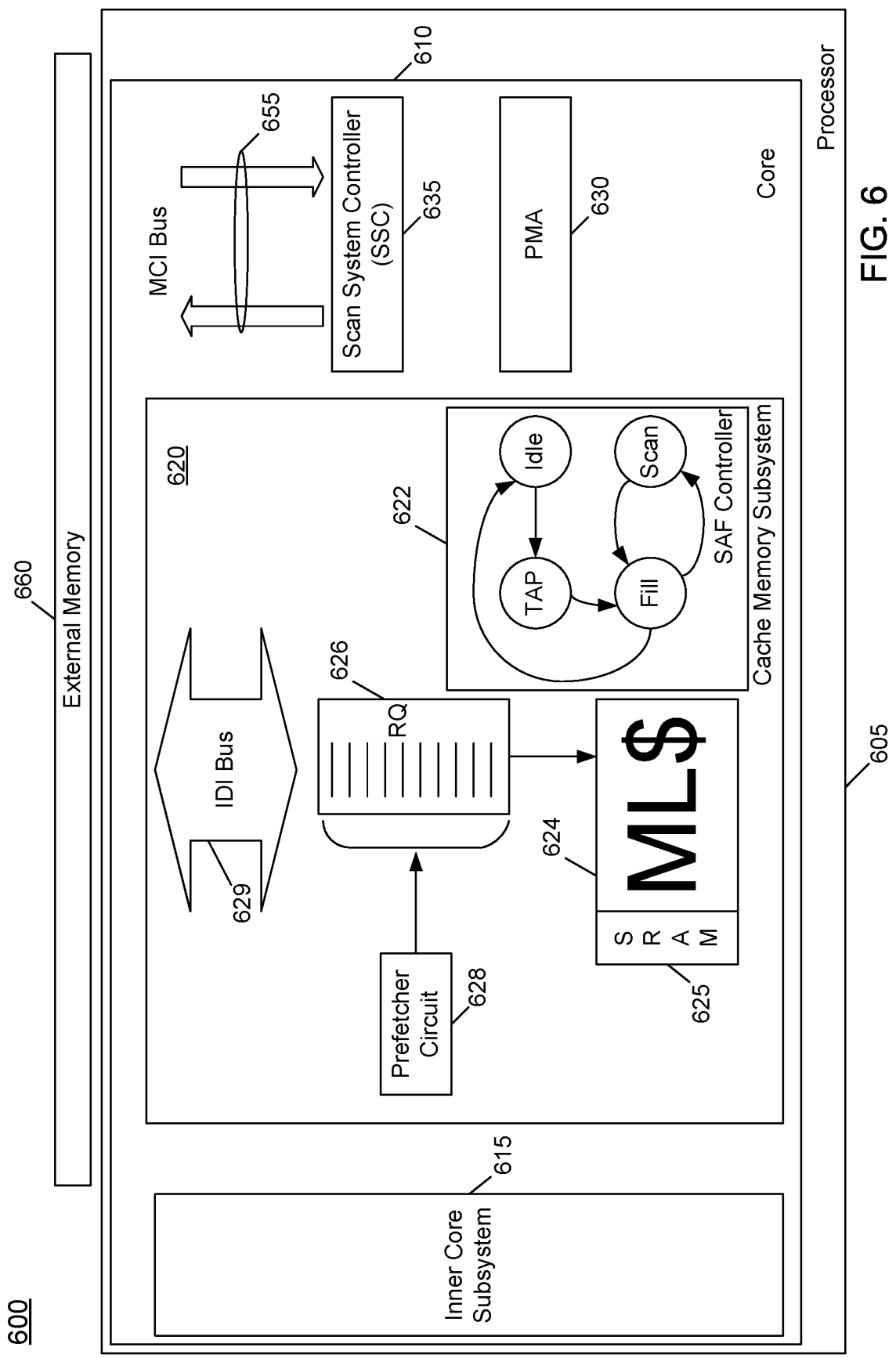
FIG. 6 is a block diagram of a portion of a system in accordance with an embodiment.

Referring now to FIG. 6, shown is a block diagram of a portion of a system in accordance with an embodiment. As shown in FIG. 6, system 600 may be any type of computing system, ranging from a relatively small device such as a portable computing device, e.g., smartphone, tablet computer, internet of things (IoT) device, to larger systems such as in-vehicle autonomous driving systems, desktop or server computer systems and so forth. As illustrated in the high level of FIG. 6, system 600 includes a processor 605 such as a given SoC and an external memory 660, such as a DRAM. In the high level shown in FIG. 6, only a single core 610 is illustrated within processor 605. Understand that many more cores and core external circuitry may be present in a processor different implementations.

At the high level shown in FIG. 6, core 610 includes an inner core subsystem 615 which may include the main processing circuitry of the core, including one or more processor pipelines and other circuitry. Core 610 further includes a cache memory subsystem 620, and a PMA 630 to control certain power management operations autonomously within the core. A scan system controller 635 may couple to an external test entity via an MCI bus 655. As illustrated, cache memory subsystem 620 includes at least one cache memory, namely a mid-level cache 624, and additional memory, namely a SRAM 625 which is a C6 SRAM in which state of inner core subsystem 615 is saved during the scan-at-field testing described herein. As further illustrated, cache memory subsystem 620 also includes a request queue 626 that acts as an interface for handling incoming and outgoing memory requests with memory 660 via an inter-die interconnect (IDI) bus 629. In an embodiment, a write to a machine specific register (MSR), which in an embodiment is a scan MSR, enables software to commence scan testing on one or more cores according to a given testing policy. Microcode may perform some preliminary steps in order to prepare the core for the scan operation, and then control is handed to field scan controller 622, also referred to as a scan-at-field (SAF) controller, included in cache memory subsystem 620.

Still as shown in FIG. 6, field scan controller 622 includes finite state machines (FSMs) that can proceed through a plurality of different states. As illustrated, field scan controller 622 includes a TAP state, which is entered from an idle state. Note that field scan controller 622 is configured to inform PMA 630 to move into a scan power mode, and cause the state machine of field scan controller 622 to switch into TAP mastering mode. Next the entire core state is saved to SRAM 626, and field scan controller 622 is activated, with any active threads placed into an inactive state. In another embodiment microcode may inform PMA 630 as part of the scan MSR prologue. In an embodiment the saving of the core state to SRAM 626 can be done by microcode as part of the WRMSR (SCAN) prologue code, and microcode then activates field scan controller 622 and moves it from the idle state to the next state.

In turn, PMA 630, in response to an indication of scan-at-field testing, may perform various operations. More specifically, in an embodiment this agent may cause operation in a special voltage/frequency condition to prevent dI/dT and IR droop phenomena. In addition, PMA 630 may switch a throttling mechanism to a non-intrusive mode for scan operation, to enable quick application of a minimum voltage/frequency. In addition, PMA 630 defers transitioning into higher frequency during the scan state, and core telemetry towards a power controller may be isolated, while ignoring the scan mode period in calculations of power/performance metrics such as average Cdyn/ICCP, residency information, throttling/scalability, etc.

In turn, scan-at-field testing as described herein proceeds from the TAP state to a fill state in which at least a portion of a test pattern is filled into MLC 624. As illustrated in FIG. 6, during a fill operation, at this stage field scan controller 622 activates prefetch circuit 628 to fill MLC 624 with a chunk of the patterns that is read from external memory 660. Since during the fill state, the core consumes low power, it is a suitable time to move to a higher frequency if an opportunity exists. As such, field scan controller 622 indicates to PMA 630 that the fill state started (for it to know it is safe to raise the frequency), and PMA 630 indicates back to field scan controller 622 when it is safe to transition to the scan state. Typically the frequency transition is faster than the fill state latency.

Once a full chunk of data is brought in, field scan controller 622 moves to a scan state in which a scan operation on that test pattern portion is performed. As seen, control proceeds iteratively between the fill state and scan state until an entire test pattern is obtained and used for testing, such that a self-test is completed and field scan controller 622 re-enters the idle state. As such, cache subsystem 620 is used to load patterns into core 610.

In the scan state, scan patterns are fed into scan system controller 635 and the scan output is compared against an expected signature. A machine check error (e.g.) is signaled in one of two cases: (1) in case the loaded scan patterns fail the integrity check (before being used); and (2) in case a mismatch is detected on the scan output against the expected signature. Note that this self-testing is performed within core 610 autonomously without any interaction with the SoC, power management related or other. Understand while shown at this high level in the embodiment of FIG. 6, many variations and alternatives are possible.

Figure 7:
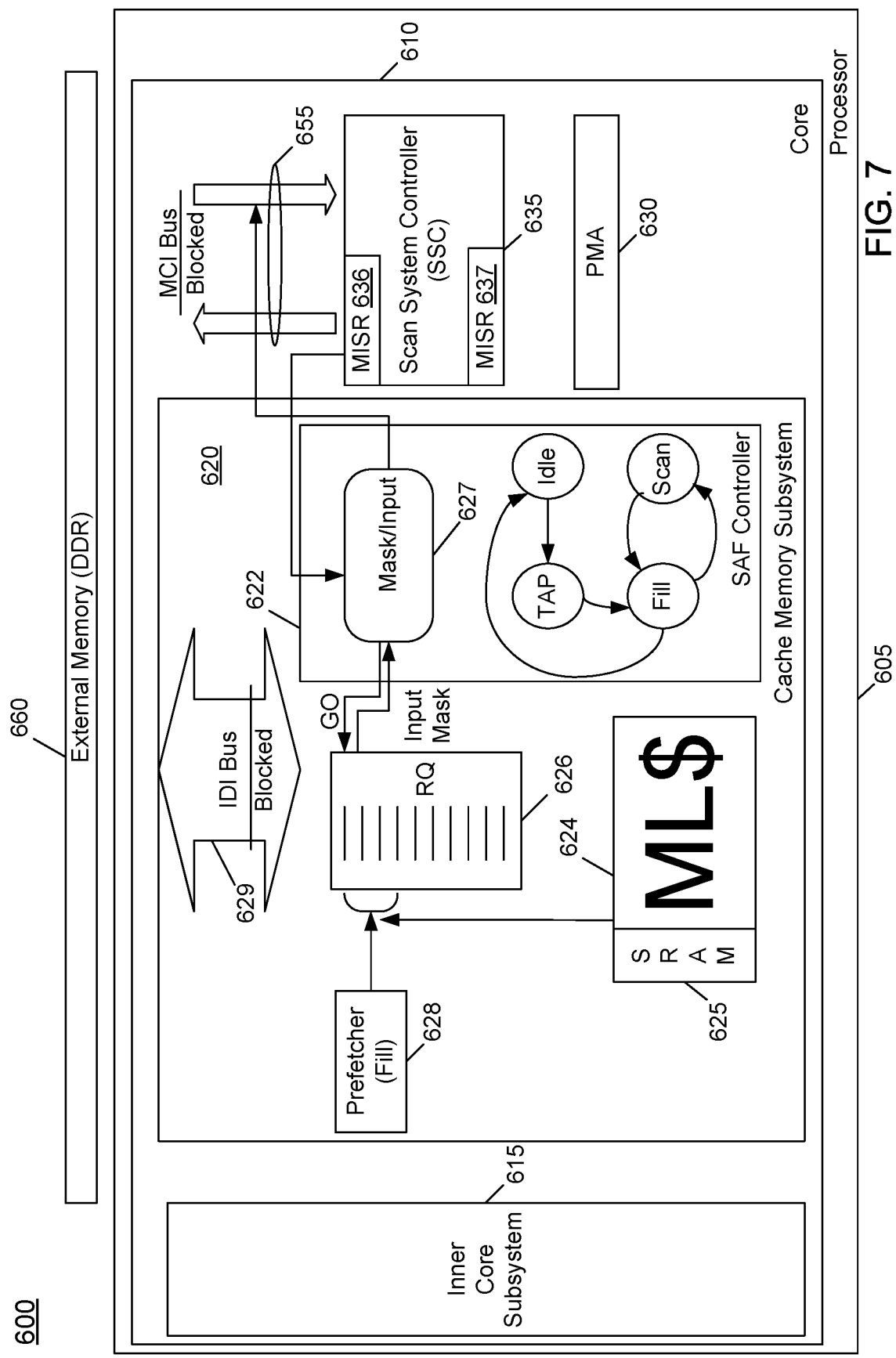
FIG. 7 is another block diagram of a system in accordance with an embodiment.

Referring now to FIG. 7, shown is another block diagram of a system in accordance with an embodiment. More specifically as shown FIG. 7, the same components are shown. However, note that during test, i.e., scan operations as herein, field scan controller 622 may control operation to isolate core 610 both from IDI bus 629 and MCI bus 655.

The illustration of FIG. 7 is during a scan state. At this stage, field scan controller 622 activates MLC hardware responsible for evicting the entire MLC, e.g., via a write back invalidate or other eviction flow. Thereafter, field scan controller 622 causes request queue 626 to work in a single entry mode; and the core-to-uncore requests are isolated from IDI 629. As such, field scan controller 622 can access a cacheline entry that becomes stuck in request queue 626, break it down to MCI packets, and communicate them to scan system controller 635 via a mask/input 627. Once all the MCI packets are extracted from a single entry, field scan controller 622 masquerades a global observation indication on that entry, and in turn request queue 626 finishes holding it, and the eviction flow can continue until all the cachelines are read, and the MCI packets are sent to scan system controller 635.

To provide end-to-end integrity assurance, scan system controller 635 is configured with multiple MISRs, including a first MISR 636 that becomes clear on every observe operation. Thereafter shift operations, in correspondence with the scan chain length, shift new data both into this first MISR and into scan chain circuitry. Next, a check integrity operation is performed to compare the MISR data to an expected data, which may trigger an error on a mismatch. After this check integrity operation, capture and observe operations occur to place the data that is shifted out of the scan chain circuitry as a result of the shift operation into another MISR 637. When an entire cache eviction operation completes, the last MCI packet holds a check result operation and the expected result. A PASS/FAIL indication is returned from scan system controller 635 to field scan controller 622.

At this point, field scan controller 622 may determine whether there are pending break events to be serviced. If so, field scan controller 622 may cause an exit from the test mode. If there are no pending break events, there are additional chunks of scan patterns to be brought in, and the last chunk received a pass indication, field scan controller 622 returns to the fill state in order to bring the next chunk.

If the test is completed, field scan controller 622 ends the scan operation and reports the last PASS/FAIL result to the processor. Finally, field scan controller 622 indicates to PMA 630 that the scan operation is completed, and PMA 630 resets core 610. But since the MLC cluster was operational during the entire scan operation, its state is not reset, so PMA 630 provides special Reset/PowerGood signals just for the clusters on which the test patterns were run, while the MLC cluster remains intact. Microcode restores the relevant state from SRAM 626 while PMA 630 exits from the scan power mode.

Embodiments may be incorporated into such products as diverse semiconductor devices to perform various functionality such as consumer electronics, server hardware, IoT platforms, autonomous driving systems, wireless products, and so forth.

Figure 8A:
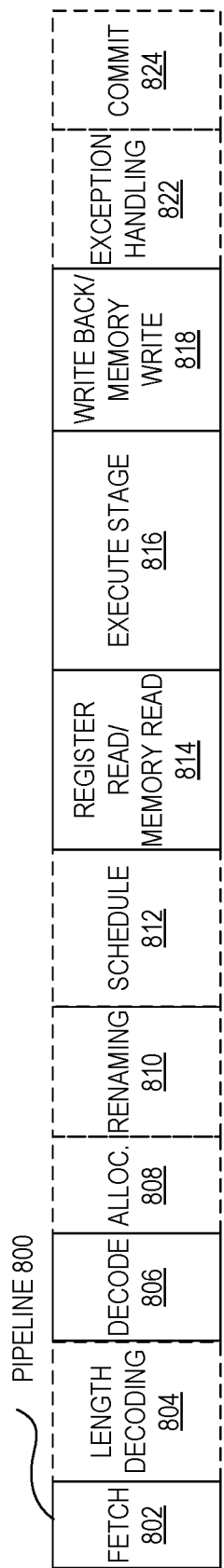
FIG. 8A is a block diagram illustrating both an exemplary in-order pipeline and an exemplary register renaming, out-of-order issue/execution pipeline according to embodiments of the invention.
Figure 8B:
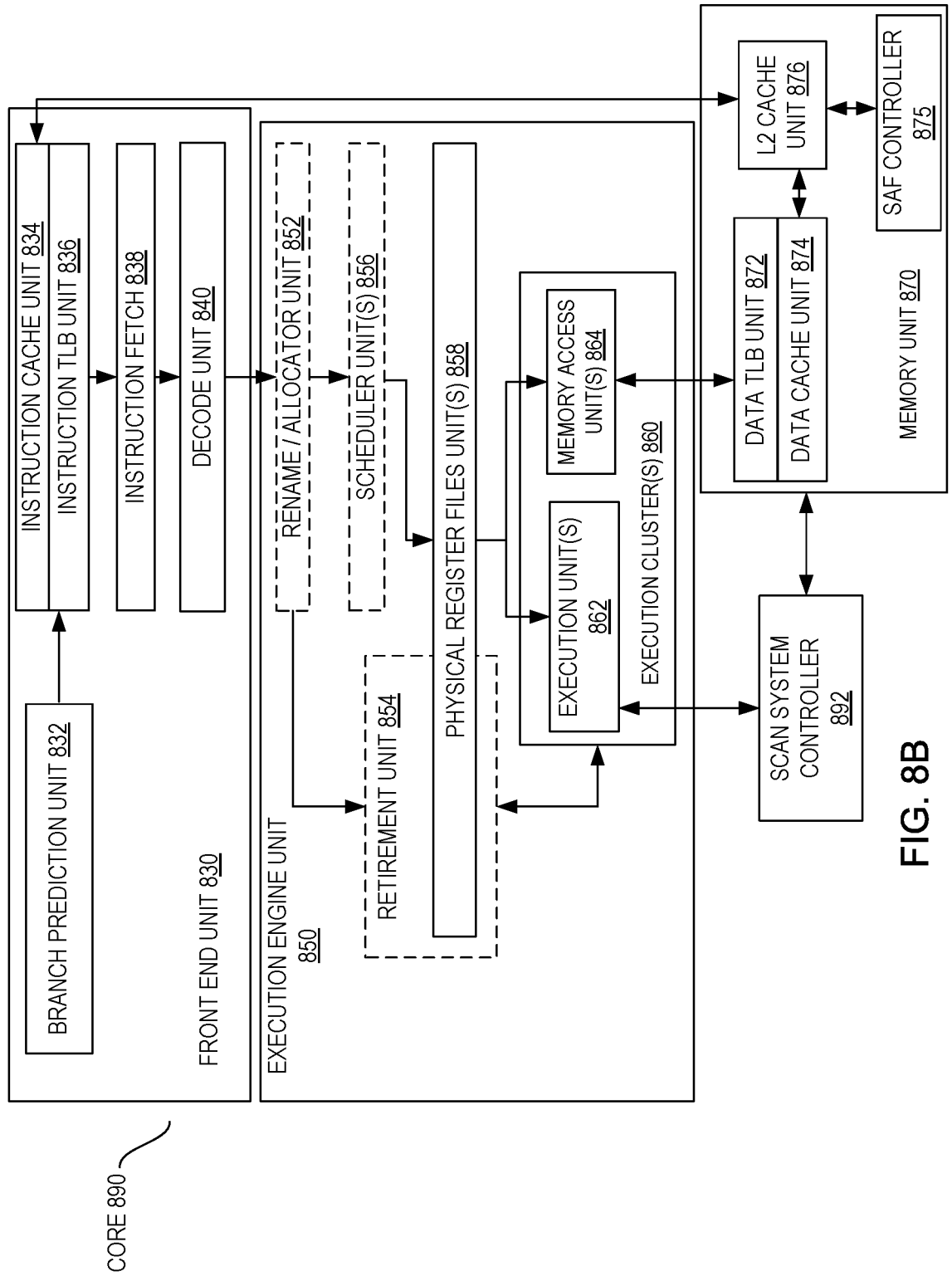
FIG. 8B is a block diagram illustrating both an exemplary embodiment of an in-order architecture core and an exemplary register renaming, out-of-order issue/execution architecture core to be included in a processor according to embodiments of the invention.

FIG. 8A is a block diagram illustrating both an exemplary in-order pipeline and an exemplary register renaming, out-of-order issue/execution pipeline according to embodiments of the invention. FIG. 8B is a block diagram illustrating both an exemplary embodiment of an in-order architecture core and an exemplary register renaming, out-of-order issue/execution architecture core to be included in a processor according to embodiments of the invention. The solid lined boxes in FIGS. 8A and 8B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 8A, a processor pipeline 800 includes a fetch stage 802, a length decode stage 804, a decode stage 806, an allocation stage 808, a renaming stage 810, a scheduling (also known as a dispatch or issue) stage 812, a register read/memory read stage 814, an execute stage 816, a write back/memory write stage 818, an exception handling stage 822, and a commit stage 824.

FIG. 8B shows processor core 890 including a front end unit 830 coupled to an execution engine unit 850, and both are coupled to a memory unit 870. The core 890 may be a reduced instruction set computing (RISC) core, a complex instruction set computing (CISC) core, a very long instruction word (VLIW) core, or a hybrid or alternative core type. As yet another option, the core 890 may be a special-purpose core, such as, for example, a network or communication core, compression engine, coprocessor core, general purpose computing graphics processing unit (GPGPU) core, graphics core, or the like.

The front end unit 830 includes a branch prediction unit 832 coupled to an instruction cache unit 834, which is coupled to an instruction translation lookaside buffer (TLB) 836, which is coupled to an instruction fetch unit 838, which is coupled to a decode unit 840. The decode unit 840 (or decoder) may decode instructions, and generate as an output one or more micro-operations, micro-code entry points, microinstructions, other instructions, or other control signals, which are decoded from, or which otherwise reflect, or are derived from, the original instructions. The decode unit 840 may be implemented using various different mechanisms. Examples of suitable mechanisms include, but are not limited to, look-up tables, hardware implementations, programmable logic arrays (PLAs), microcode read only memories (ROMs), etc. In one embodiment, the core 890 includes a microcode ROM or other medium that stores microcode for certain macroinstructions (e.g., in decode unit 840 or otherwise within the front end unit 830). The decode unit 840 is coupled to a rename/allocator unit 852 in the execution engine unit 850.

The execution engine unit 850 includes the rename/allocator unit 852 coupled to a retirement unit 854 and a set of one or more scheduler unit(s) 856. The scheduler unit(s) 856 represents any number of different schedulers, including reservations stations, central instruction window, etc. The scheduler unit(s) 856 is coupled to the physical register file(s) unit(s) 858. Each of the physical register file(s) units 858 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 858 comprises a vector register unit, a write mask register unit, and a scalar register unit. These register units may provide architectural vector registers, vector mask registers, and general purpose registers. The physical register file(s) unit(s) 858 is overlapped by the retirement unit 854 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 854 and the physical register file(s) unit(s) 858 are coupled to the execution cluster(s) 860. The execution cluster(s) 860 includes a set of one or more execution units 862 and a set of one or more memory access units 864. The execution units 862 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 856, physical register file(s) unit(s) 858, and execution cluster(s) 860 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 864). It should also be understood that where separate pipelines are used, one or more of these pipelines may be out-of-order issue/execution and the rest in-order.

The set of memory access units 864 is coupled to the memory unit 870, which includes a data TLB unit 872 coupled to a data cache unit 874 coupled to a level 2 (L2) cache unit 876. In one exemplary embodiment, the memory access units 864 may include a load unit, a store address unit, and a store data unit, each of which is coupled to the data TLB unit 872 in the memory unit 870. The instruction cache unit 834 is further coupled to a level 2 (L2) cache unit 876 in the memory unit 870. The L2 cache unit 876 is coupled to one or more other levels of cache and eventually to a main memory. The memory unit 870 further includes a scan-at-field (SAF) controller 875 which may control core autonomous self-testing as described herein. To this end, direct communication may occur between the SAF controller 875 and a scan system controller 892, which may be configured to perform scan chain testing on circuitry of the execution units 862 and other components of the core 890.

By way of example, the exemplary register renaming, out-of-order issue/execution core architecture may implement the pipeline 800 as follows: 1) the instruction fetch 838 performs the fetch and length decoding stages 802 and 804; 2) the decode unit 840 performs the decode stage 806; 3) the rename/allocator unit 852 performs the allocation stage 808 and renaming stage 810; 4) the scheduler unit(s) 856 performs the schedule stage 812; 5) the physical register file(s) unit(s) 858 and the memory unit 870 perform the register read/memory read stage 814; the execution cluster 860 perform the execute stage 816; 6) the memory unit 870 and the physical register file(s) unit(s) 858 perform the write back/memory write stage 818; 7) various units may be involved in the exception handling stage 822; and 8) the retirement unit 854 and the physical register file(s) unit(s) 858 perform the commit stage 824.

The core 890 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 890 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 834/874 and a shared L2 cache unit 876, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 9B:
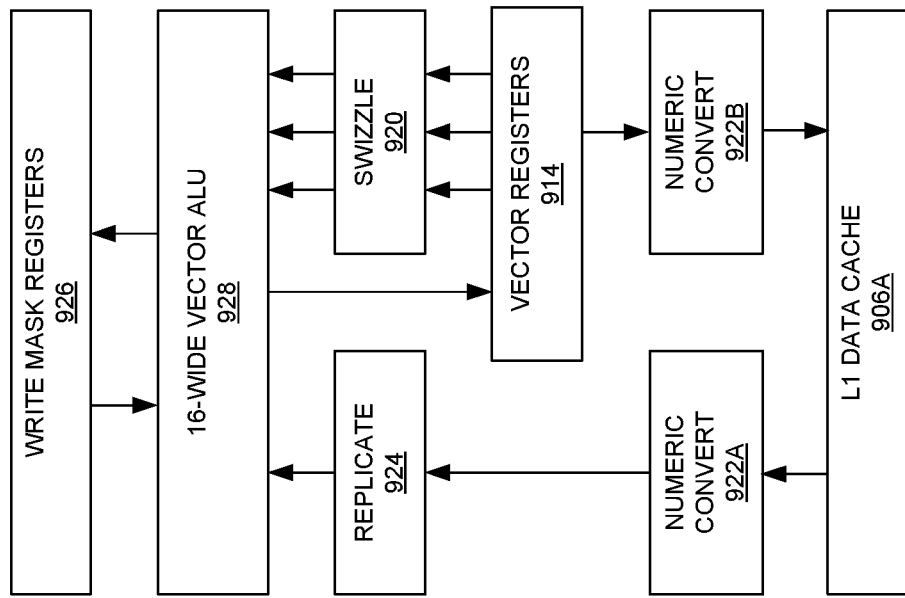
FIGS. 9A and 9B illustrate a block diagram of a more specific exemplary in-order core architecture, which core would be one of several logic blocks (including other cores of the same type and/or different types) in a chip.
Figure 9A:
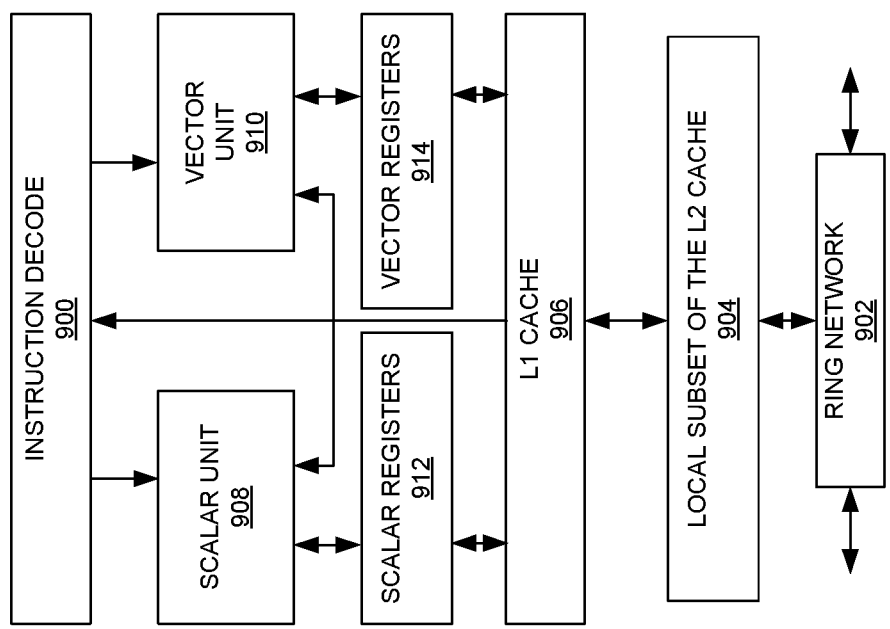

FIGS. 9A and 9B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 9A is a block diagram of a single processor core, along with its connection to the on-die interconnect network 902 and with its local subset of the Level 2 (L2) cache 904, according to embodiments of the invention. In one embodiment, an instruction decoder 900 supports the x86 instruction set with a packed data instruction set extension. An L1 cache 906 allows low-latency accesses to cache memory into the scalar and vector units. While in one embodiment (to simplify the design), a scalar unit 908 and a vector unit 910 use separate register sets (respectively, scalar registers 912 and vector registers 914) and data transferred between them is written to memory and then read back in from a level 1 (L1) cache 906, alternative embodiments of the invention may use a different approach (e.g., use a single register set or include a communication path that allow data to be transferred between the two register files without being written and read back).

The local subset of the L2 cache 904 is part of a global L2 cache that is divided into separate local subsets, one per processor core. Each processor core has a direct access path to its own local subset of the L2 cache 904. In an embodiment, the local subset of the L2 cache 904 may include a field scan controller to orchestrate core autonomous in-field self-testing as described herein. Data read by a processor core is stored in its L2 cache subset 904 and can be accessed quickly, in parallel with other processor cores accessing their own local L2 cache subsets. Data written by a processor core is stored in its own L2 cache subset 904 and is flushed from other subsets, if necessary. The ring network ensures coherency for shared data. The ring network is bi-directional to allow agents such as processor cores, L2 caches and other logic blocks to communicate with each other within the chip. Each ring data-path is 512-bits wide per direction.

FIG. 9B is an expanded view of part of the processor core in FIG. 9A according to embodiments of the invention. FIG. 9B includes an L1 data cache 906A part of the L1 cache 904, as well as more detail regarding the vector unit 910 and the vector registers 914. Specifically, the vector unit 910 is a 16-wide vector processing unit (VPU) (see the 16-wide ALU 928), which executes one or more of integer, single-precision float, and double-precision float instructions. The VPU supports swizzling the register inputs with swizzle unit 920, numeric conversion with numeric convert units 922A-B, and replication with replication unit 924 on the memory input. Write mask registers 926 allow predicating resulting vector writes.

Figure 10:
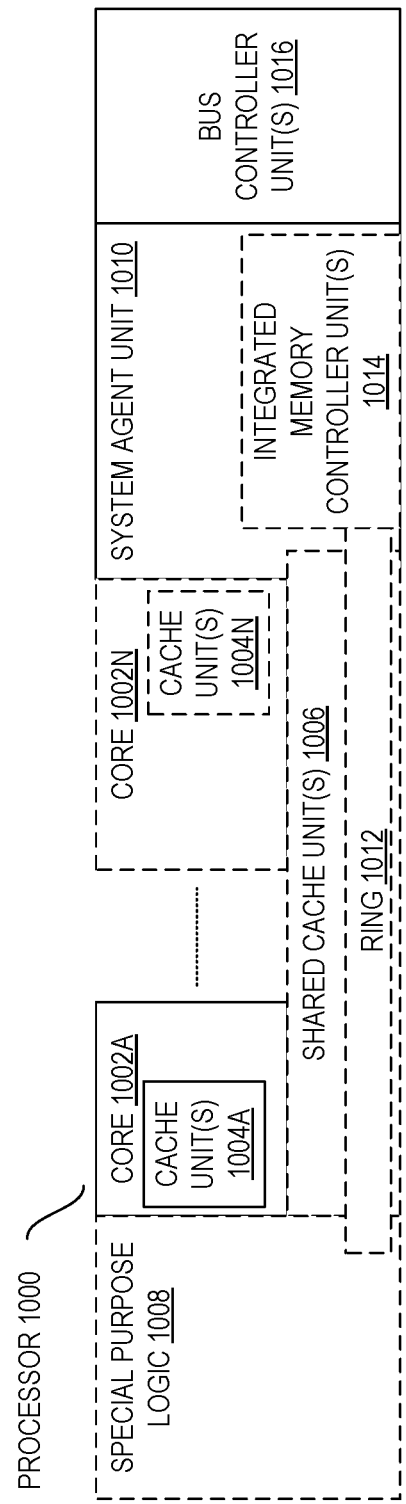
FIG. 10 is a block diagram of a processor that may have more than one core, may have an integrated memory controller, and may have integrated graphics according to embodiments of the invention.

FIG. 10 is a block diagram of a processor 1000 that may have more than one core, may have an integrated memory controller, and may have integrated graphics according to embodiments of the invention. The solid lined boxes in FIG. 10 illustrate a processor 1000 with a single core 1002A, a system agent 1010, a set of one or more bus controller units 1016, while the optional addition of the dashed lined boxes illustrates an alternative processor 1000 with multiple cores 1002A-N, a set of one or more integrated memory controller unit(s) in the system agent unit 1010, and special purpose logic 1008.

Thus, different implementations of the processor 1000 may include: 1) a CPU with the special purpose logic 1008 being integrated graphics and/or scientific (throughput) logic (which may include one or more cores), and the cores 1002A-N being one or more general purpose cores (e.g., general purpose in-order cores, general purpose out-of-order cores, a combination of the two); 2) a coprocessor with the cores 1002A-N being a large number of special purpose cores intended primarily for graphics and/or scientific (throughput); and 3) a coprocessor with the cores 1002A-N being a large number of general purpose in-order cores. Thus, the processor 1000 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1000 may be a part of and/or may be implemented on one or more substrates using any of a number of process technologies, such as, for example, BiCMOS, CMOS, or NMOS.

The memory hierarchy includes one or more levels of cache units 1004A-N within the cores (one of which may include a field scan controller and other circuitry as described herein), a set or one or more shared cache units 1006, and external memory (not shown) coupled to the set of integrated memory controller units 1014. The set of shared cache units 1006 may include one or more mid-level caches, such as level 2 (L2), level 3 (L3), level 4 (L4), or other levels of cache, a last level cache (LLC), and/or combinations thereof. While in one embodiment a ring based interconnect unit 1012 interconnects the special purpose logic 1008, the set of shared cache units 1006, and the system agent unit 1010/integrated memory controller unit(s) 1014, alternative embodiments may use any number of well-known techniques for interconnecting such units. In one embodiment, coherency is maintained between one or more cache units 1006 and cores 1002 A-N.

In some embodiments, one or more of the cores 1002A-N are capable of multithreading. The system agent unit 1010 includes those components coordinating and operating cores 1002A-N. The system agent unit 1010 may include for example a power control unit (PCU) and a display unit. The PCU may be or include logic and components needed for regulating the power state of the cores 1002A-N and the integrated graphics logic 1008. The display unit is for driving one or more externally connected displays.

The cores 1002A-N may be homogenous or heterogeneous in terms of architecture instruction set; that is, two or more of the cores 1002A-N may be capable of execution the same instruction set, while others may be capable of executing only a subset of that instruction set or a different instruction set.

FIGS. 11-14 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 11:
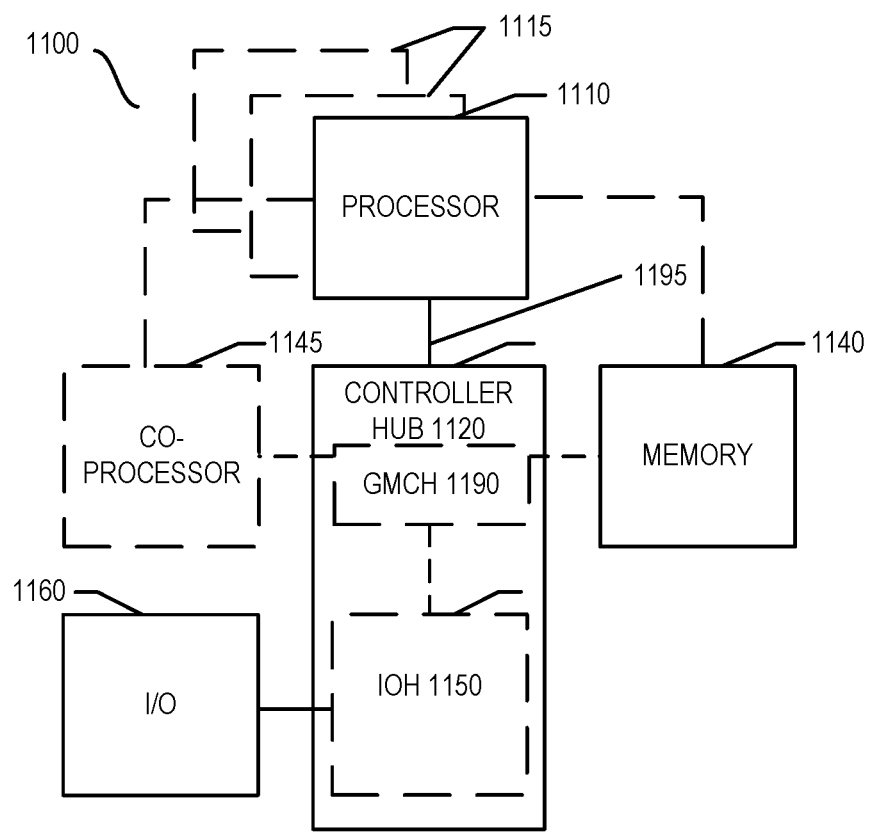
FIG. 11 is a block diagram of a system in accordance with one embodiment of the present invention.

Referring now to FIG. 11, shown is a block diagram of a system 1100 in accordance with one embodiment of the present invention. The system 1100 may include one or more processors 1110, 1115, which are coupled to a controller hub 1120. In one embodiment the controller hub 1120 includes a graphics memory controller hub (GMCH) 1190 and an Input/Output Hub (IOH) 1150 (which may be on separate chips); the GMCH 1190 includes a memory controller and a graphics controller to which are coupled memory 1140 and a coprocessor 1145; the IOH 1150 couples input/output (I/O) devices 1160 to the GMCH 1190. Alternatively, one or both of the memory and graphics controllers are integrated within the processor (as described herein), the memory 1140 and the coprocessor 1145 are coupled directly to the processor 1110, and the controller hub 1120 in a single chip with the IOH 1150.

The optional nature of additional processors 1115 is denoted in FIG. 11 with broken lines. Each processor 1110, 1115 may include one or more of the processing cores described herein and may be some version of the processor 1000.

The memory 1140 may be, for example, dynamic random access memory (DRAM), phase change memory (PCM), or a combination of the two. For at least one embodiment, the controller hub 1120 communicates with the processor(s) 1110, 1115 via a multi-drop bus, such as a frontside bus (FSB), point-to-point interface such as QuickPath Interconnect (QPI), or similar connection 1195.

In one embodiment, the coprocessor 1145 is a special-purpose processor, such as, for example, a high-throughput MIC processor, a network or communication processor, compression engine, graphics processor, GPGPU, embedded processor, or the like. In one embodiment, controller hub 1120 may include an integrated graphics accelerator.

There can be a variety of differences between the physical resources 1110, 1115 in terms of a spectrum of metrics of merit including architectural, microarchitectural, thermal, power consumption characteristics, and the like.

In one embodiment, the processor 1110 executes instructions that control data processing operations of a general type. Embedded within the instructions may be coprocessor instructions. The processor 1110 recognizes these coprocessor instructions as being of a type that should be executed by the attached coprocessor 1145. Accordingly, the processor 1110 issues these coprocessor instructions (or control signals representing coprocessor instructions) on a coprocessor bus or other interconnect, to coprocessor 1145. Coprocessor(s) 1145 accept and execute the received coprocessor instructions.

Figure 12:
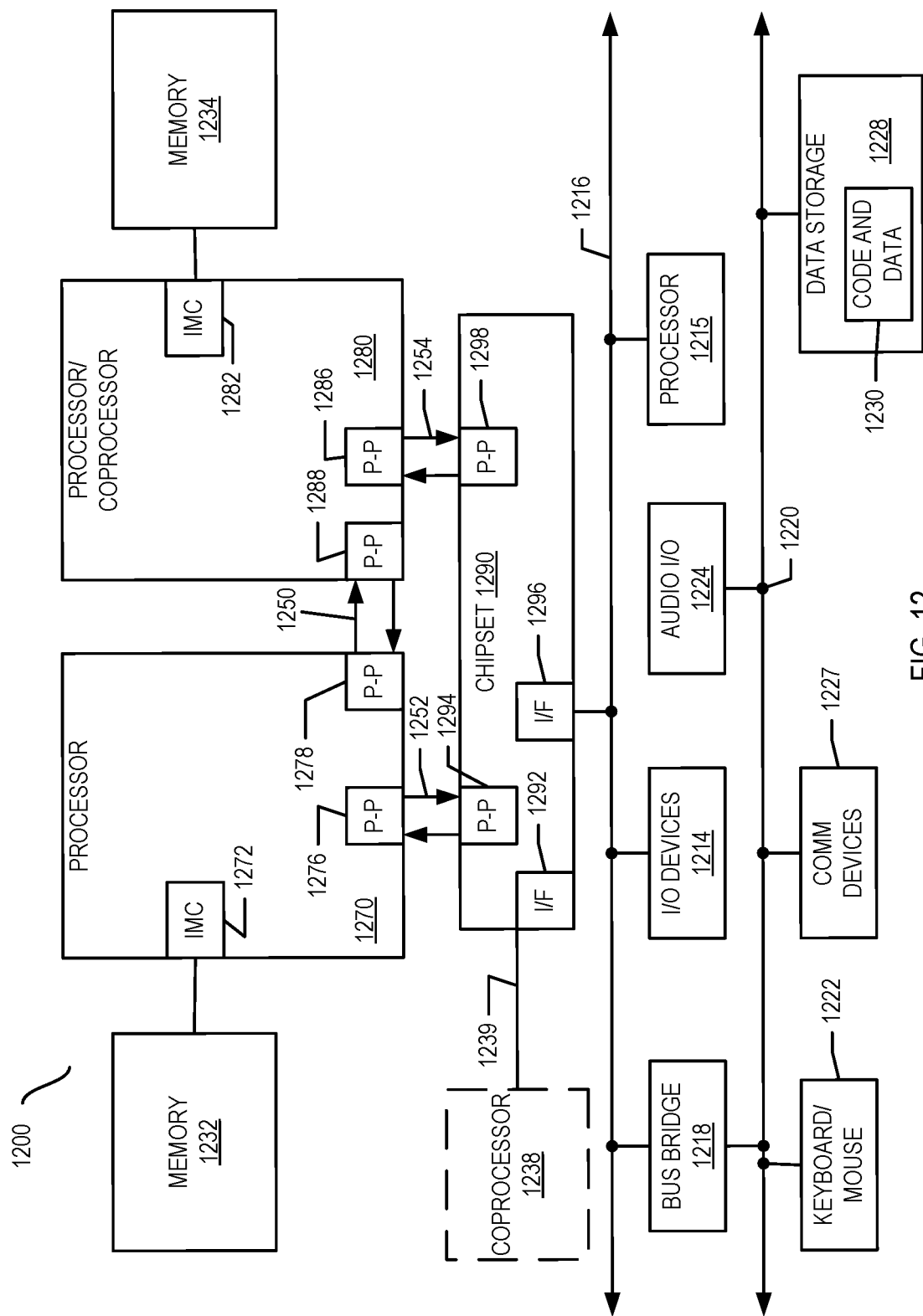
FIG. 12 is a block diagram of a first more specific exemplary system in accordance with an embodiment of the present invention.

Referring now to FIG. 12, shown is a block diagram of a first more specific exemplary system 1200 in accordance with an embodiment of the present invention. As shown in FIG. 12, multiprocessor system 1200 is a point-to-point interconnect system, and includes a first processor 1270 and a second processor 1280 coupled via a point-to-point interconnect 1250. Each of processors 1270 and 1280 may be some version of the processor 1000. In one embodiment of the invention, processors 1270 and 1280 are respectively processors 1110 and 1110, while coprocessor 1238 is coprocessor 1145. In another embodiment, processors 1270 and 1280 are respectively processor 1110 and coprocessor 1145.

Processors 1270 and 1280 are shown including integrated memory controller (IMC) units 1272 and 1282, respectively. Processor 1270 also includes as part of its bus controller units point-to-point (P-P) interfaces 1276 and 1278; similarly, second processor 1280 includes P-P interfaces 1286 and 1288. Processors 1270, 1280 may exchange information via a point-to-point (P-P) interface 1250 using P-P interface circuits 1278, 1288. As shown in FIG. 12, IMCs 1272 and 1282 couple the processors to respective memories, namely a memory 1232 and a memory 1234, which may be portions of main memory locally attached to the respective processors.

Processors 1270, 1280 may each exchange information with a chipset 1290 via individual P-P interfaces 1252, 1254 using point to point interface circuits 1276, 1294, 1286, 1298. Chipset 1290 may optionally exchange information with the coprocessor 1238 via a high-performance interface 1239. In one embodiment, the coprocessor 1238 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1290 may be coupled to a first bus 1216 via an interface 1296. In one embodiment, first bus 1216 may be a Peripheral Component Interconnect (PCI) bus, or a bus such as a PCI Express bus or another third generation I/O interconnect bus, although the scope of the present invention is not so limited.

As shown in FIG. 12, various I/O devices 1214 may be coupled to first bus 1216, along with a bus bridge 1218 which couples first bus 1216 to a second bus 1220. In one embodiment, one or more additional processor(s) 1215, such as coprocessors, high-throughput MIC processors, GPGPU's, accelerators (such as, e.g., graphics accelerators or digital signal processing (DSP) units), field programmable gate arrays, or any other processor, are coupled to first bus 1216. In one embodiment, second bus 1220 may be a low pin count (LPC) bus. Various devices may be coupled to a second bus 1220 including, for example, a keyboard and/or mouse 1222, communication devices 1227 and a storage unit 1228 such as a disk drive or other mass storage device which may include instructions/code and data 1230, in one embodiment. Further, an audio I/O 1224 may be coupled to the second bus 1220. Note that other architectures are possible. For example, instead of the point-to-point architecture of FIG. 12, a system may implement a multi-drop bus or other such architecture.

Figure 13:
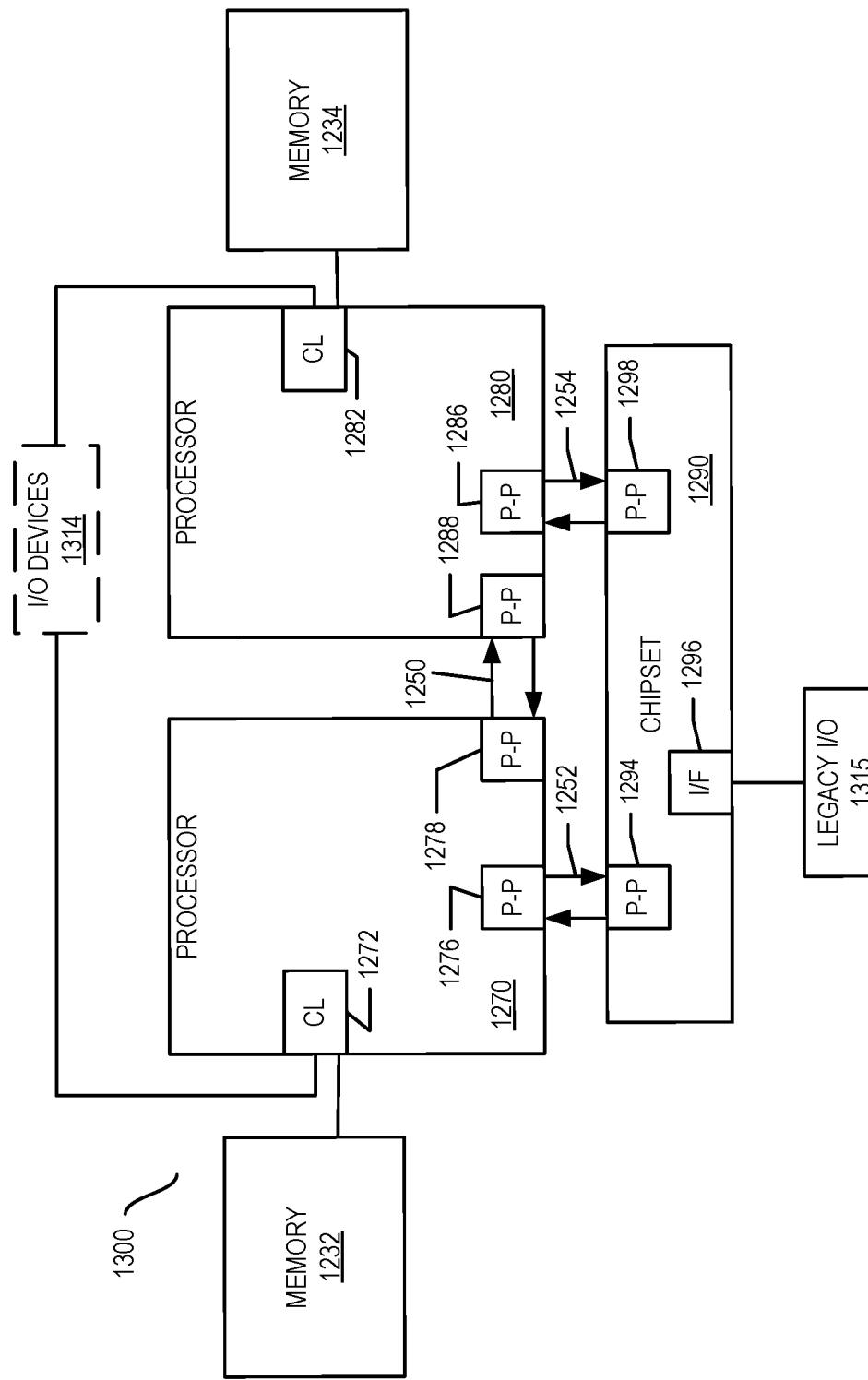
FIG. 13 is a block diagram of a second more specific exemplary system in accordance with an embodiment of the present invention.

Referring now to FIG. 13, shown is a block diagram of a second more specific exemplary system 1300 in accordance with an embodiment of the present invention. Like elements in FIGS. 12 and 13 bear like reference numerals, and certain aspects of FIG. 12 have been omitted from FIG. 13 in order to avoid obscuring other aspects of FIG. 13.

FIG. 13 illustrates that the processors 1270, 1280 may include integrated memory and I/O control logic ("CL") 1272 and 1282, respectively. Thus, the CL 1272, 1282 include integrated memory controller units and include I/O control logic. FIG. 13 illustrates that not only are the memories 1232, 1234 coupled to the CL 1272, 1282, but also that I/O devices 1314 are also coupled to the control logic 1272, 1282. Legacy I/O devices 1315 are coupled to the chipset 1290.

Figure 14:
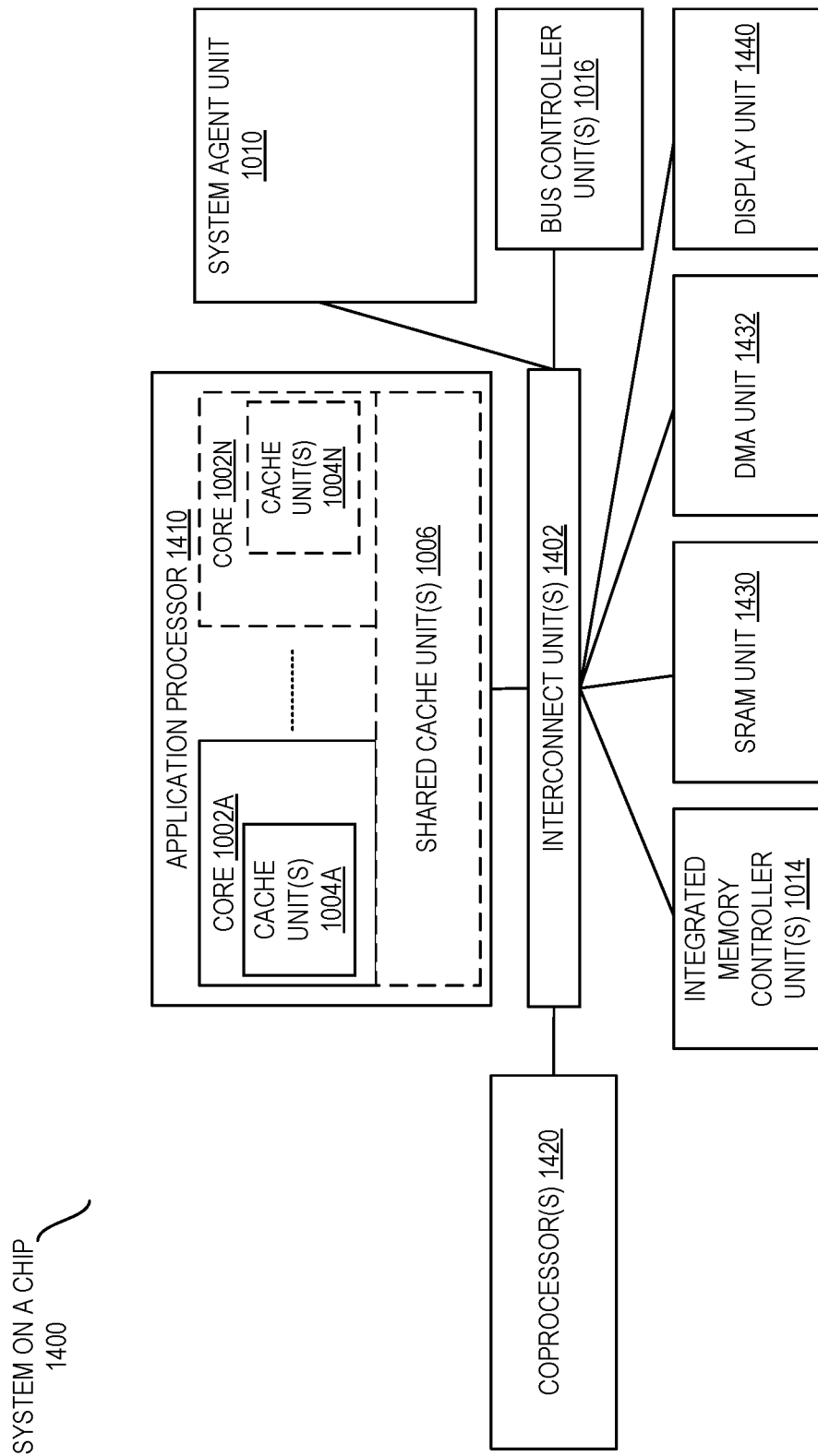
FIG. 14 is a block diagram of a SoC in accordance with an embodiment of the present invention.

Referring now to FIG. 14, shown is a block diagram of a SoC 1400 in accordance with an embodiment of the present invention. Similar elements in FIG. 10 bear like reference numerals. Also, dashed lined boxes are optional features on more advanced SoCs. In FIG. 14, an interconnect unit(s) 1402 is coupled to: an application processor 1410 which includes a set of one or more cores 1002A-N (including constituent cache units 1004A-N) and shared cache unit(s) 1006; a system agent unit 1010; a bus controller unit(s) 1016; an integrated memory controller unit(s) 1014; a set or one or more coprocessors 1420 which may include integrated graphics logic, an image processor, an audio processor, and a video processor; an static random access memory (SRAM) unit 1430; a direct memory access (DMA) unit 1432; and a display unit 1440 for coupling to one or more external displays. In one embodiment, the coprocessor(s) 1420 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1230 illustrated in FIG. 12, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 15:
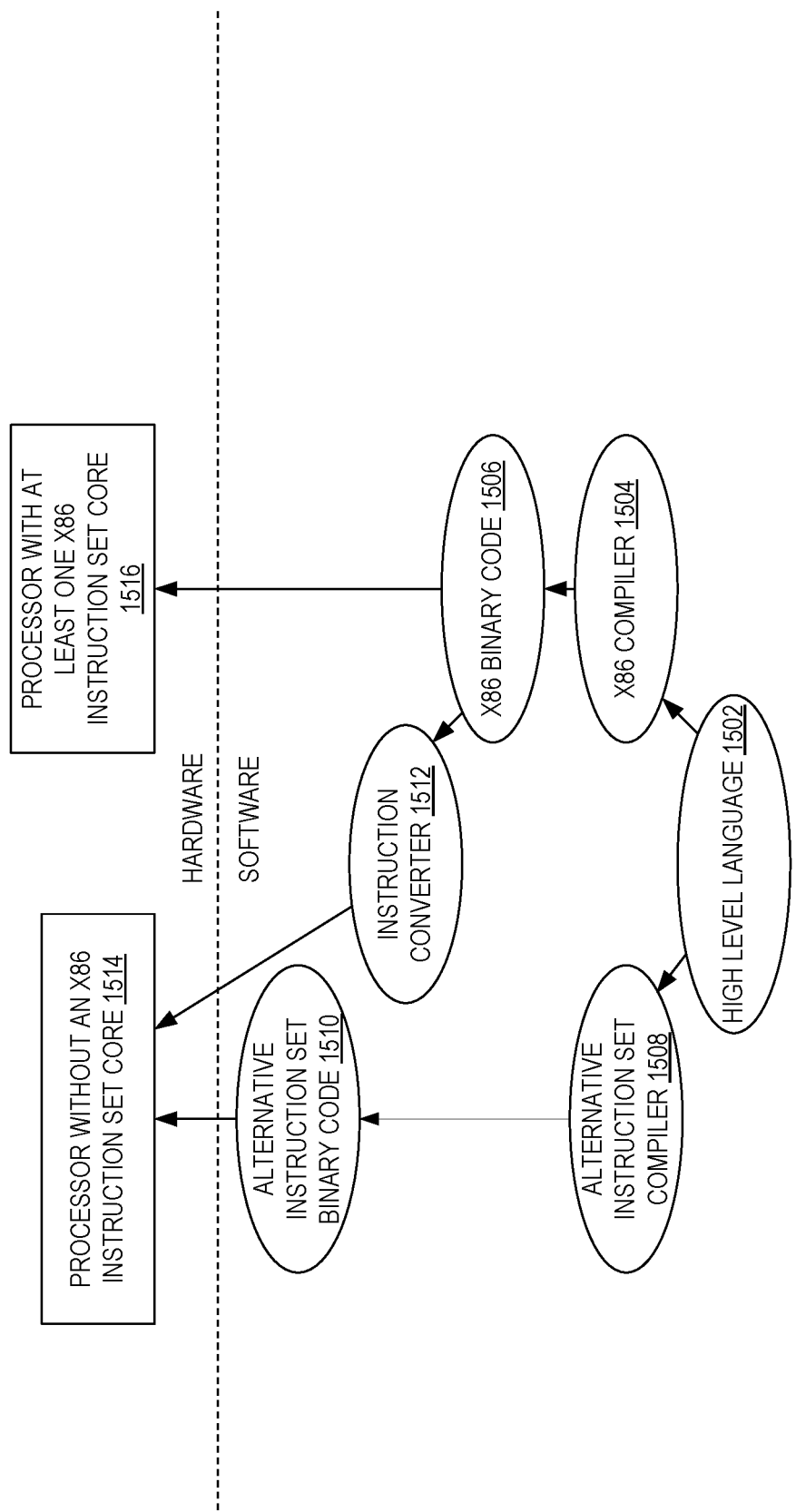
FIG. 15 is a block diagram contrasting the use of a software instruction converter to convert binary instructions in a source instruction set to binary instructions in a target instruction set according to embodiments of the invention.

FIG. 15 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 15 shows a program in a high level language 1502 may be compiled using an x86 compiler 1504 to generate x86 binary code 1506 that may be natively executed by a processor with at least one x86 instruction set core 1516. The processor with at least one x86 instruction set core 1516 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1504 represents a compiler that is operable to generate x86 binary code 1506 (e.g., object code) that can, with or without additional linkage processing, be executed on the processor with at least one x86 instruction set core 1516. Similarly, FIG. 15 shows the program in the high level language 1502 may be compiled using an alternative instruction set compiler 1508 to generate alternative instruction set binary code 1510 that may be natively executed by a processor without at least one x86 instruction set core 1514 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1512 is used to convert the x86 binary code 1506 into code that may be natively executed by the processor without an x86 instruction set core 1514. This converted code is not likely to be the same as the alternative instruction set binary code 1510 because an instruction converter capable of this is difficult to make; however, the converted code will accomplish the general operation and be made up of instructions from the alternative instruction set. Thus, the instruction converter 1512 represents software, firmware, hardware, or a combination thereof that, through emulation, simulation or any other process, allows a processor or other electronic device that does not have an x86 instruction set processor or core to execute the x86 binary code 1506.

The following examples pertain to further embodiments.

In one example, a processor includes: a scan system controller to control test operations on the processor in response to test commands from an external test entity; and at least one core to execute instructions. The at least one core may include: a first subsystem having one or more pipelines to execute the instructions; and a second subsystem having a cache memory and a field scan controller to control a field test mode of the processor to perform a self-test of the at least one core during field operation, where the field scan controller is to obtain a test pattern from an external memory and cause the scan system controller to test circuitry of the first subsystem using the test pattern.

In an example, the field scan controller is to control a core autonomous scan-at-field test mode of the processor.

In an example, the at least one core further includes a power management agent, the power management agent to cause the at least one core to enter into a scan power mode in response to an indication of the scan-at-field test mode from the field scan controller.

In an example, the power management agent is to cause the at least one core to exit the scan power mode at a conclusion of the scan-at-field test mode and enter into a normal power mode, the normal power mode at a lower performance state than a performance state of the scan power mode.

In an example, the field scan controller is to perform: a fill operation to cause a portion of the test pattern to be filled into the cache memory; and a scan operation to send packets of the portion of the test pattern to the scan system controller.

In an example, the field scan controller is to iteratively perform the fill operation and the scan operation until all of the test pattern has been obtained from the external memory.

In an example, the scan operation comprises an eviction operation to evict segments of the portion of the test pattern from the cache memory into a request queue, and parse the segments of the portion of the test pattern into the packets and send the packets to the scan system controller.

In an example, the scan system controller comprises a first MISR and a second MISR, where the field scan controller is to cause the scan system controller to check a test pattern for integrity before the scan system controller is to test the circuitry of the first subsystem with the test pattern.

In an example, the scan system controller is to store a result of the test of the circuitry of the first subsystem in the second MISR and compare the result to an expected result received from the field scan controller.

In another example, a method comprises: initiating, in a field scan controller of a processor, a structural test of the processor during field operation of the processor; causing, by the field scan controller, one or more pipelines of a first core of the processor to enter into an autonomous structural test mode; loading at least a portion of a test pattern from an external memory to a cache memory of the first core and providing packets of the at least portion of the test pattern to a scan system controller of the processor to cause the scan system controller to perform the structural test on the one or more pipelines of the first core; and thereafter exiting the autonomous structural test mode and enabling the first core to continue execution of a prior workload.

In an example, the method further comprises: receiving an external request in the first core during the autonomous structural test mode; and in response to the external request, causing the core to exit the autonomous structural test mode.

In an example, the method further comprises determining whether to cause the core to exit the autonomous structural test mode based at least in part on a priority of the external request.

In an example, the method further comprises preventing the core from exiting the autonomous structural test mode when the priority is less than a threshold.

In an example, the method further comprises reporting a result of the structural test via a log report, comprising reporting an error and thereafter causing the core to continue the execution of the prior workload.

In an example, the method further comprises: loading the at least the portion of the test pattern via a fill operation triggered by the field scan controller; and sending packets of the portion of the test pattern to the scan system controller via a scan operation triggered by the field scan controller.

In an example, the method further comprises: checking the at least the portion of the test pattern for integrity before testing the one or more pipelines with the at least the portion of the test pattern; and after testing the one or more pipelines with the at least the portion of the test pattern, comparing a result of the testing with an expected result received from the field scan controller.

In another example, a computer readable medium including instructions is to perform the method of any of the above examples.

In another example, a computer readable medium including data is to be used by at least one machine to fabricate at least one integrated circuit to perform the method of any one of the above examples.

In another example, an apparatus comprises means for performing the method of any one of the above examples.

In yet another example, a system includes a SoC comprising: a scan system controller to control test operations on the SoC in response to test commands from an external test entity; one or more pipelines to execute instructions; a cache memory; and a field scan controller to enable a field test mode of the SoC to perform a self-test of the SoC during field operation, where the field scan controller is to obtain a test pattern and store at least a portion of the test pattern in the cache memory, and send at least the portion of the test pattern to the scan system controller to test of the one or more pipelines using at least the portion of the test pattern. The system may further include a system memory coupled to the SoC, the system memory to store the test pattern.

In an example, the field scan controller is to perform: a fill operation to cause at least the portion of the test pattern to be filled into the cache memory; and a scan operation to send packets of at least the portion of the test pattern to the scan system controller.

In an example, the field scan controller is to iteratively perform the fill operation and the scan operation until all of the test pattern has been obtained from the system memory.

In an example, the scan system controller is to check at least the portion of the test pattern for integrity before the test of the one or more pipelines with at least the portion of the test pattern.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A processor comprising:
   a scan system controller to control test operations on the processor in response to test commands from an external test entity; and
   at least one core to execute instructions, the at least one core including:
     a first subsystem having one or more pipelines to execute the instructions; and
     a second subsystem having a cache memory and a field scan controller to control a field test mode of the processor to perform a self-test of the at least one core during field operation, wherein the field scan controller is to obtain a test pattern from an external memory and cause the scan system controller to test circuitry of the first subsystem using the test pattern.

2. The processor of claim 1, wherein the second subsystem is a cache subsystem of the at least one core, and wherein the field scan controller in the cache subsystem is to control a core autonomous scan-at-field test mode of the processor.

3. The processor of claim 2, wherein the at least one core further includes a power management agent, the power management agent to cause the at least one core to enter into a scan power mode in response to an indication of the scan-at-field test mode from the field scan controller.

4. The processor of claim 3, wherein the power management agent is to cause the at least one core to exit the scan power mode at a conclusion of the scan-at-field test mode and enter into a normal power mode, the normal power mode at a lower performance state than a performance state of the scan power mode.

5. The processor of claim 1, wherein the field scan controller is to perform:
   a fill operation to cause a portion of the test pattern to be filled into the cache memory; and
   a scan operation to send packets of the portion of the test pattern to the scan system controller.

6. The processor of claim 5, wherein the field scan controller is to iteratively perform the fill operation and the scan operation until all of the test pattern has been obtained from the external memory.

7. The processor of claim 5, wherein the scan operation comprises an eviction operation to evict segments of the portion of the test pattern from the cache memory into a request queue, and parse the segments of the portion of the test pattern into the packets and send the packets to the scan system controller.

8. The processor of claim 1, wherein the scan system controller comprises a first multiple input shift register (MISR) and a second MISR, wherein the field scan controller is to cause the scan system controller to check a test pattern for integrity before the scan system controller is to test the circuitry of the first subsystem with the test pattern.

9. The processor of claim 8, wherein the scan system controller is to store a result of the test of the circuitry of the first subsystem in the second MISR and compare the result to an expected result received from the field scan controller.

10. A non-transitory machine-readable medium having stored thereon instructions which, if performed by a machine, cause the machine to perform a method comprising:
    initiating, in a field scan controller of a processor, a structural test of the processor during field operation of the processor;
    causing, by the field scan controller, one or more pipelines of a first core of the processor to enter into an autonomous structural test mode;
    loading at least a portion of a test pattern from an external memory to a cache memory of the first core and providing packets of the at least portion of the test pattern to a scan system controller of the processor to cause the scan system controller to perform the structural test on the one or more pipelines of the first core; and
    thereafter exiting the autonomous structural test mode and enabling the first core to continue execution of a prior workload.

11. The machine-readable medium of claim 10, wherein the field scan controller is included in a cache subsystem of the first core, and wherein the method further comprises:
    receiving an external request in the first core during the autonomous structural test mode; and
    in response to the external request, causing the core to exit the autonomous structural test mode.

12. The machine-readable medium of claim 11, wherein the method further comprises determining whether to cause the core to exit the autonomous structural test mode based at least in part on a priority of the external request.

13. The machine-readable medium of claim 12, wherein the method further comprises preventing the core from exiting the autonomous structural test mode when the priority is less than a threshold.

14. The machine-readable medium of claim 10, wherein the method further comprises reporting a result of the structural test via a log report, comprising reporting an error and thereafter causing the core to continue the execution of the prior workload.

15. The machine-readable medium of claim 10, wherein the method further comprises:
    loading the at least the portion of the test pattern via a fill operation triggered by the field scan controller; and
    sending packets of the portion of the test pattern to the scan system controller via a scan operation triggered by the field scan controller.

16. The machine-readable medium of claim 10, wherein the method further comprises:
    checking the at least the portion of the test pattern for integrity before testing the one or more pipelines with the at least the portion of the test pattern; and
    after testing the one or more pipelines with the at least the portion of the test pattern, comparing a result of the testing with an expected result received from the field scan controller.

17. A system comprising:
a system on chip (SoC) comprising:
- a scan system controller to control test operations on the SoC in response to test commands from an external test entity;
- one or more pipelines to execute instructions;
- a cache memory; and
- a field scan controller to enable a field test mode of the SoC to perform a self-test of the SoC during field operation, wherein the field scan controller is to obtain a test pattern and store at least a portion of the test pattern in the cache memory, and send at least the portion of the test pattern to the scan system controller to test of the one or more pipelines using at least the portion of the test pattern; and
- a system memory coupled to the SoC, the system memory to store the test pattern.

18. The system of claim 17, wherein the field scan controller is included in a cache subsystem of the SoC, and wherein the field scan controller is to perform:
- a fill operation to cause at least the portion of the test pattern to be filled into the cache memory; and
- a scan operation to send packets of at least the portion of the test pattern to the scan system controller.

19. The system of claim 18, wherein the field scan controller is to iteratively perform the fill operation and the scan operation until all of the test pattern has been obtained from the system memory.

20. The system of claim 17, wherein the scan system controller is to check at least the portion of the test pattern for integrity before the test of the one or more pipelines with at least the portion of the test pattern.

* * * * *